United States Patent
Noda et al.

(10) Patent No.: US 6,780,493 B2
(45) Date of Patent: Aug. 24, 2004

(54) WIRING BOARD AND A PROCESS OF PRODUCING A WIRING BOARD

(75) Inventors: Osamu Noda, Neyagawa (JP); Hideo Hatanaka, Katano (JP); Kazunori Sakamoto, Katano (JP); Masanaru Hasegawa, Yawata (JP)

(73) Assignee: Matsushita Electric Industrial Co., Ltd., Osaka-fu (JP)

( * ) Notice: Subject to any disclaimer, the term of this patent is extended or adjusted under 35 U.S.C. 154(b) by 358 days.

(21) Appl. No.: 09/983,614

(22) Filed: Oct. 25, 2001

(65) Prior Publication Data

US 2002/0045394 A1 Apr. 18, 2002

Related U.S. Application Data

(63) Continuation of application No. 09/115,994, filed on Jul. 15, 1998.

(30) Foreign Application Priority Data

Jul. 16, 1997 (JP) .............................................. 9-191218

(51) Int. Cl.⁷ .............................. B32B 3/00; H05K 1/00
(52) U.S. Cl. ...................... 428/209; 428/901; 174/258; 174/259; 174/264
(58) Field of Search ................................ 428/209, 901; 174/258, 259, 264, 250

(56) References Cited

U.S. PATENT DOCUMENTS

| 3,932,689 | A | * | 1/1976 | Watanabe et al. ........... 428/418 |
| 4,302,501 | A |   | 11/1981 | Nagashima |
| 4,830,691 | A |   | 5/1989 | Kida et al. |
| 5,220,135 | A |   | 6/1993 | Kawakami et al. |
| 5,294,755 | A |   | 3/1994 | Kawakami et al. |
| 5,388,328 | A |   | 2/1995 | Yokono et al. |
| 5,484,647 | A |   | 1/1996 | Nakatani et al. |
| 5,677,393 | A |   | 10/1997 | Ohmori et al. |
| 5,888,627 | A | * | 3/1999 | Nakatani .................... 428/209 |
| 6,245,696 | B1 | * | 6/2001 | Haas et al. ................. 442/348 |

FOREIGN PATENT DOCUMENTS

| EP | 0 645 950 | 3/1995 |
| JP | 4189131 | 7/1992 |
| JP | 6-196868 | 7/1994 |
| JP | 6-268345 | 9/1994 |
| JP | 2587596 | 6/1995 |
| JP | 7-263828 | 10/1995 |
| JP | 8-78803 | 3/1996 |
| JP | 8-316598 | 11/1996 |

* cited by examiner

*Primary Examiner*—Cathy Lam
(74) *Attorney, Agent, or Firm*—Wenderoth, Lind & Ponack, L.L.P.

(57) ABSTRACT

In a wiring board, predetermined wiring patterns which are formed on both sides of an insulation substrate are electrically connected by an electrically conductive material provided in through holes formed through the insulation substrate. The insulation substrate is composed of a resin impregnated fibrous sheet and a heat resistant film. The present invention solves the problems of the wiring board which are caused by irregularities on the surface of the resin impregnated fibrous sheet. The problems include insufficient adhesion strength between the wiring pattern and the insulation substrate or the limitation of fineness of the wiring pattern due to the irregularities on the surface of the printed wiring board which are formed upon the thermocompression bonding process.

23 Claims, 7 Drawing Sheets

(a)

(b)

WIRING BOARD AND A PROCESS OF PRODUCING A WIRING BOARD

This is a continuation application of Ser. No. 09/115,994, filed Jul. 15, 1998.

BACKGROUND OF THE INVENTION

1. Field of the Invention

The present invention relates to a wiring board having a through hole and a production process of such a wiring board.

2. Description of the Related Art

Recently, under pursuing compaction, thinning, lightning, and multi-functionality of electronic equipment, various technical developments of a wiring board for highly densely mounting of electronic parts which constitute the electronic equipment have been intensively carried out together with compaction and thinning of the electronic parts.

Especially nowadays, it is highly desired with rapid developments of mounting techniques to provide an inexpensive multi-layer printed wiring board on which semiconductor chips such as LSI chips can be mounted highly densely and which can adapt to a high speed circuit.

In order to meet such a desire, a substrate for circuit formation is disclosed (in Japanese Patent Kokai Publication No. 6-268345), in which wiring patterns which are so laminated on an insulation substrate that they sandwich it, are electrically connected by an electrically conductive material filled in through holes or via holes.

FIGS. 9(a) to (f) schematically show steps for the production of such a substrate for the circuit formation. It is to be noted that FIG. 9 shows cross sectional views which are perpendicular to main surfaces of the substrate (also in the other drawings, the same cross sectional views are shown). The substrate for the circuit formation is produced as follows:

As shown in FIG. 9(a), through holes 2 are first formed at predetermined positions through an insulation substrate 1 made of a resin impregnated fibrous sheet 1 as a prepreg such as an aramid fiber/epoxy resin composite of which each side is coated with a non-tacky release film 17 (which may be referred to as a parting film).

Then, the through holes 2 are filled with an electrically conductive paste 3 by for example printing, followed by removing the release films 17 to have a state as shown in FIG. 9(b). The release paste comprising electrically conductive particles (for example metal fine particles) and a thermosetting resin component as a binder protrudes above each surface of the insulation substrate 1 in an amount corresponding to a thickness of the release film 17. It is to be noted that the protrusion is shown exaggeratedly for ease of understanding (the same is applicable to the other drawings).

Next, a copper foil 4 is placed on the each side of the resin impregnated fibrous sheet 1, and by pressing and heating the sheet, the resin impregnated fibrous sheet 1 in a prepreg state and the conductive paste 3 are compressed, the resin contained in the sheet and the paste is cured, and the copper foils 4 are bonded to the sheet 1 as shown in FIG. 9(c). Since the resin impregnated fibrous sheet 1 includes at least some voids therein, it is compressed when it is heated and pressed. Simultaneously, the resin of the conductive paste penetrates into the inside of the resin impregnated fibrous sheet 1 when heated and pressed, so that a concentration of the conductive fine particles in the paste is increased (that is, the conductive fine particles are dandified, and therefore an electrical resistance of the conductive fine particles is reduced, which increases reliability of the electrical connection with the paste). Thus, simultaneously with bonding the copper foils 4 to the both sides of the resin impregnated fibrous sheet 1, the copper foils 4 are electrically connected with the through holes which are filled with the conductive paste 3.

Then, the copper foils 4 on both sides of the resin impregnated fibrous sheet 1 are etched with the conventional photolithography method, and wiring patterns 5a and 5b are formed, so that a wiring board 6 having the wiring pattern on each side is produced as shown in FIG. 9(d).

Further, the produced two-sided wiring board 6 is located between other insulation substrates 1a and 1b which function as intermediate connectors as shown in FIG. 9(e). The intermediate connectors are produced by the steps of FIGS. 9(a) and (b) so that they have the through holes 2a and 2b at predetermined positions which are filled with electrically conductive materials 3a and 3b, respectively. Then, copper foils 7a and 7b are placed on the outsides of the insulation substrates 1a and 1b (namely, the sides remote from the insulation substrate 1).

Thereafter, the wiring board 6, the insulation substrates 1a and 1b, and the copper foils 7a and 7b are heated and pressed so that a multi layer integrated body is formed, of which copper foils 7a and 7b as the outermost surfaces are then etched by the conventional photolithography method. Thus, a multi layer wiring board 9 having the four wiring layers as shown in FIG. 9(f) can be obtained in which the wiring patterns 5a and 5b on the resin impregnated fibrous substrate 1 are electrically connected with the wiring patterns 8a and 8b by the conductive paste 3a and 3b filled in the through holes 2a and 2b.

With the resin impregnated fibrous sheet such as an aramid fiber/epoxy resin prepreg in which a non-woven fabric of aramid fibers is impregnated with an epoxy resin, the aramid fibers contained therein cause irregularities on surfaces of the resin impregnated fibrous sheet, and for example, the resin impregnated fibrous sheet 1 has surfaces having irregularities which directly correspond to forms of the aramid fibers.

When the wiring patterns 5a and 5b are formed by etching the copper foils 4 bonded with heat and pressure to such a resin impregnated fibrous sheet 1, the copper foils 4 also have irregularities on their surfaces due to the irregularities of the resin impregnated fibrous sheet 1, which is likely to cause voids or gaps between the copper foils 4 and etching resist layers (not shown). Upon etching, an etching solution penetrates into the gaps, so that it becomes difficult to form wiring pattern 5a and 5b as predetermined. Especially, a problem is caused in that it is difficult to form fine wiring patterns, which accommodate the highly densely mounting of microelectronic parts such as semiconductor bare chips.

Further, the resin impregnated fibrous sheet is in such a state that a resin material is impregnated into a substrate made of the fibers, so that a structure of the resin impregnated fibrous sheet is unlikely to be uniform as a whole. For example, for the resin impregnated fibrous sheet such as an aramid fiber/epoxy resin prepreg in which the non-woven fabric of the aramid fibers is impregnated with an epoxy resin, since the aramid fibers are present discontinuously or exposed partly on surface skin layers of the sheet, the following two problems are likely to occur:

1) When the resin impregnated fibrous sheet is bonded with heat and pressure to a copper foil, the resin impregnated in the resin impregnated fibrous sheet contributes to the bond between them. An amount of the resin is small in portions under the copper foil where the aramid fibers are present or exposed partly on the surface skin layer of the insulation substrate. As a result of this, since the bond between the copper foil and the resin impregnated fibrous sheet is insufficient, no sufficient bonding strength is available between them. Thus, when electronic parts are mounted on a wiring pattern on such a wiring board, no large mounting strength is available; and 2) When the surfaces of the resin impregnated fibrous sheet have the irregularities, adhesion strength between the release film 17 and the resin impregnated fibrous sheet 1 is insufficient during the production steps of the wiring board as shown in FIGS. 9(a) to (f), so that the conductive paste 3 is likely to penetrate into gaps between the release film 17 and the resin impregnated fibrous sheet 1 upon filling the conductive paste 3 into the through holes. As a result of this, the conductive paste 3 extends beyond a diameter of the through hole 2 over the insulation substrate 1. Thus, when a separation between the through hole and the wiring pattern formed on the substrate, or between the through hole and other through hole is small, an electric short circuit is likely to be formed between them. This limits the formation of highly dense wiring patterns.

On the other hand, there has been proposed a method of forming a fine wiring pattern in which the fine wiring pattern is beforehand formed on a release supporting plate separately, and the fine wiring pattern is transferred to a surface of an insulation substrate (see Naoki FUKUTOMI et al., "Development of Fine Line Printed Wiring Technology by Plated Wiring Pattern Transfer Method", IEICE '89/4 vol. J72-C No. 4, pp 243–253 (1989)). However, even when such a method is employed, since the surface of the resin impregnated fibrous sheet as the insulation substrate has the irregularities, it is difficult to precisely transfer the fine wiring pattern onto the insulation substrate.

Also, as a method which improves the adhesion strength between an insulation substrate and a metal foil such as a copper, there is disclosed a method in which a surface of a resin impregnated fibrous sheet as the insulation substrate in which an epoxy resin is impregnated is coated with an adhesive resin (see Japanese Patent Kokai Publication No.8-316598). In this method, the impregnated resin of the sheet is in contact with the adhesive resin which is compatible to the impregnated resin while both of them are uncured, and then they are heated and pressed so that they are compressed and cured and thus bonded together. Thus, it is difficult to fully avoid the effects of the irregularities of the non-woven fabric surface.

Further, as a wiring board technique which makes highly dense mounting possible, there are disclosed methods in which thermosetting resin layers are provided on surfaces of both sides of an insulation substrate of a resin impregnated fibrous sheet (see Japanese Patent Kokai Publication Nos.7-263828 and 8-78803). In those methods, uncured thermosetting resin layers are formed on the insulation substrate of which resin was cured, then through holes are formed, which are filled with a conductive paste, and then the substrate is heated and pressed. Since the insulation substrate itself was already cured, the substrate is not substantially compressed, so that the conductive paste in the through holes is also not compressed, resulting in that no densification of the conductive paste is achieved in the through holes. Therefore, electrical connection reliabilities between wirings by means of the conductive paste in the through holes (resistance lowering of the conductive paste, resistance stability of the conductive paste, and ensuring adhesions between the paste and the insulation substrate and between the paste and a conductor for wiring) become insufficient.

SUMMARY OF THE INVENTION

It is an object of the present invention to overcome the above problems. That is, it is an object to provide a printed wiring board which makes it possible to mount parts more highly densely and which has an improved reliability by overcoming the above problems while keeping advantages of a substrate for circuit formation in which a conductive material filled into a through hole(s) electrically connects wiring patterns provided on both sides of an insulation substrate, and also to provide a process for the production of such a wiring board.

The inventors have made intensive studies, and completed the present inventions by finding that when a composite (which comprises a compressible resin impregnated fibrous sheet as a prepreg and a flat heat resistant film, preferably a heat resistant resin film which is compatible to the resin impregnated fibrous sheet and which is provided on at least one of main surfaces of the resin impregnated fibrous sheet) is used as an insulation substrate and a wiring pattern is formed on the insulation substrate, a surface of the insulation substrate on which the wiring pattern is formed becomes substantially flat even though a surface of the resin impregnated sheet is not flat (namely having irregularities), so that formation of a fine wiring pattern becomes possible and thereby reliability of the electrical connections of wirings is easily ensured.

That is, the present invention provides a both side or two-sided wiring board in which predetermined wiring patterns, especially fine wiring patterns formed on both sides of an insulation substrate which comprises a resin impregnated fibrous sheet and a heat resistant film provided on at least one side, preferably on both sides of the resin impregnated fibrous sheet, are electrically connected by means of an electrically conductive material filled in a through hole(s) which is formed through the insulation substrate.

In the present specification; the term "both side wiring board" is intended to mean a wiring board in which an insulation substrate (which is usually in the form of a sheet) has a wiring pattern on both sides. Also, a term "multi layer wiring board" which will be explained below is intended to mean a wiring board containing at least three wiring pattern layers which are separated from one another by insulation substrates each located between adjacent two wiring patterns, and which are connected with one another by means of an electrically conductive material filled in through holes which are formed through the insulation substrates (thus, having a structure in which the insulation substrates and the wiring patterns are located alternately).

The both side wiring board as described above is produced by a process of the present invention comprising the steps of:

(1) providing the heat resistant film on at least one side of the resin impregnated fibrous sheet so as to obtain a composite as an insulation substrate;

(2) providing a release film on an exposed surface of the heat resistant film so as to form a pre-wiring board;

(3) forming at least one through hole which passes through the insulation substrate and the release film;

(4) filling the through hole with an electrically conductive material;

(5) removing both release films from the pre-wiring board so as to obtain the insulation substrate in which the heat resistant film is exposed on at least one side of the insulation substrate; and (6) providing a wiring material (for example a metal foil such as a copper foil) on each side of the insulation substrate, and heating and pressing the insulation substrate and the wiring materials together so as to bond them integrally, followed by forming the wiring materials into predetermined wiring patterns.

Forming the wiring materials into the predetermined wiring patterns, namely patterning may be carried out by etching the wiring materials using the conventional photolithography method.

According to the present invention, since the surface of the insulation substrate on which the wiring material is located is flat, adhesion between a photo mask and the wiring material is improved during the etching step of the wiring material using the photolithography method so that a fine wiring pattern is able to be formed precisely. As the wiring material, instead of the metal foil, an electrically conductive paste, an electrically conductive ink and so on may be used. In this case, providing the conductive material may be carried out not before, but after heating and pressing is carried out. Alternatively, when the predetermined wiring patterns are directly formed by printing, the patterning may be omitted.

According to the process of the present invention as described above, the novel printed wiring board can be inexpensively produced which includes a further improved reliabilities relative to the conventional printed wiring board having the via holes and on which fine wiring patterns are formed so that micro electronic parts can be highly densely mounted on the fine wiring patterns.

In the above production process according to the present invention, step (6) may be replaced with step (7) which entails placing onto the exposed heat resistant film, a wiring pattern supporting plate comprising a release supporting plate on which a predetermined wiring pattern has been beforehand formed while aligning with the through holes, and heating and pressing the plate and the insulation substrate together followed by removing the release supporting plate, that is, the step of transferring the wiring pattern on the plate to the insulation substrate. Generally, the release supporting plate may be made of a sheet of an electrically conductive material (for example, a stainless steel). The wiring pattern supporting plate may be produced by plating a wiring material (for example, copper) on the electrically conductive material, which is etched so as to leave the predetermined wiring pattern. For the detailed information as to the wiring pattern supporting plate, the above referenced literature "Development of Fine Line Printed Wiring Technology by Plated Wiring Pattern Transfer Method" can be cited, and the disclosure of the literature is incorporated by reference in this specification.

According to the present invention, since the exposed surface of the insulation substrate is substantially flat, a finer wiring pattern can be formed precisely when the transferring step is combined.

The formation of the through holes in the process according to the present invention is known also from the three patent publications which are referred to above. For example, a laser process may be used for the formation of the through holes. For the detailed information as to the through hole formation, the above patent publications can be cited, and the technical disclosures of these publications may be incorporated in this specification by reference. With the formation of the via holes as described, thin through holes which are adapted to the fine wiring pattern may be formed rapidly and easily through the insulation substrate having the release films.

It is noted that there is no specific limitation as to the conductive material which is filled into the through holes, provided that the material can be filled into the through holes, and will electrically connect wiring patterns placed on both sides of the insulation substrate thereafter. In particular, an electrically conductive paste or fine metal powder (such as fine solder powder), having good fluidity may be used. When such a conductive material is used, sufficient filling properties and highly reliable connections are ensured even though a diameter of the through hole is reduced with the wiring patterns being finer. Filling of such a conductive material in the through holes may be carried out by any appropriate method. For example, the printing method can fill the conductive paste into substantially the entirety of the through holes.

Figure 1:
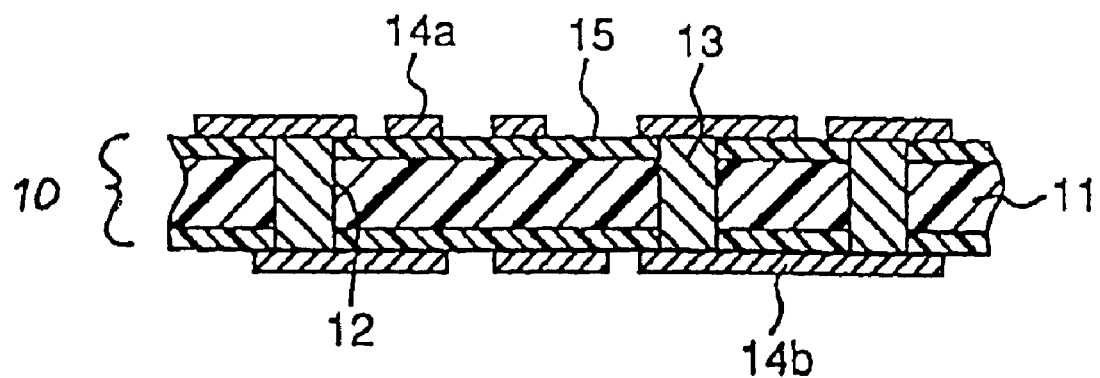
FIG. 1 shows a schematic cross sectional view of a both side wiring board constructed in accordance with a first of the present invention.

In the drawings, numerals used therein indicate the following:

10 denotes an insulation substrate, 11 denotes a resin impregnated fibrous sheet, 12 denotes a through hole, 13 denotes an electrically conductive material (conductive paste), 14a, 14b denote a wiring pattern, 15 denotes a heat resistant film, 16 denotes a release film, 18 denotes a copper foil, 19 denotes both side (two-sided) wiring board, 20 denotes an intermediate connector, 21a, 21b, 21 c, 21d denote wiring patterns, 23 denotes an intermediate connector, 24, 25 denote wiring boards, and 30 denotes a preform of an intermediate connector.

DETAILED DESCRIPTION OF THE INVENTION

In the present invention, the insulation substrate is composed of the resin impregnated fibrous sheet and the heat resistant film.

In the present invention, the resin impregnated fibrous sheet is a conventionally used one for the wiring substrate, and it is a so-called prepreg which contains a thermosetting resin in a semi-cured condition before being formed into a wiring board. Usually, the resin impregnated fibrous sheet may be a fabric as a substrate (for example, non-woven cloth, woven cloth, paper and so on) which is impregnated with a thermosetting resin such as a phenol resin, an epoxy resin and so on followed by semi-curing the resin. The fabric may be made of an inorganic fiber (for example a glass fiber and an alumina fiber), an organic fiber (for example a polyamide based fiber such as an aramid fiber, and an aromatic polyester based liquid crystal polymer fiber), or a combination of these fibers. More specifically, the resin impregnated fibrous sheet includes a non-woven fabric of the aramid fiber which has been impregnated with the thermosetting epoxy resin. Other resin impregnated fibrous sheets which can be used in the present invention include a glass fiber-epoxy resin composite, a glass fiber-bismaleimide triazine (BT) resin composite, and an aramid fiber-bismaleimide triazine (BT) resin composite. The resin impregnated fibrous sheet contains the cured resin after it has been formed into the wiring board.

The resin impregnated fibrous sheet as described above is substantially electrically insulative. Generally, it is compressible, namely, when the sheet is heated to a predetermined curing temperature, the sheet is compressed and cured with a force which perpendicularly acts on a sheet surface. Generally, the sheet contains at least some voids therein, and thus the voids are reduced or substantially disappear when subjected to heat and pressure, so that the thickness of the sheet is reduced. However, in the present invention, the compressible sheet includes the following embodiment in which the thickness of the sheet is reduced: even though the sheet does not substantially contain any void or even though the voids of the sheet, if any, are not substantially reduced, the sheet is spread when a force is applied perpendicularly to the sheet surface so that the thickness of the sheet is reduced. It is of course that the compressible sheet, includes the following embodiment of reduction of the thickness: combination of the reduction of the voids and spreading of the sheet results in the reduction of the sheet thickness. In fact, the sheet thickness is often reduced by 20 to 30% with heat and pressure.

The resin impregnated fibrous sheet as described above has appropriate compressibility so that it is possible for the conductive material filled, in the through holes (for example, the conductive paste), to be subjected to a compression effect when the insulation substrate is heated and compressed. Also, the conductive material is dandified, which easily provides electrical connection reliabilities between the wiring patterns to be connected by the conductive material (for example, the reduction of resistance and the resistance stability of the conductive material itself, and adhesion ensuring between the conductive material, and the substrate material and the wiring patterns), whereby the wiring board is provided which has good heat resistance and good mechanical strength.

In the present invention, the heat resistant film is intended to mean a film which is not melted when the insulation substrate is heated and pressed so as to cure the thermosetting resin which is contained in the substrate, and at least a surface of the heat resistant film which is remote from the resin impregnated fibrous sheet is substantially flat. The heat resistant film is insulative and non-compatible with the resin impregnated fibrous sheet. Specifically, the heat resistant film may be made of an inorganic material (for example a metal oxide, especially a mica), or an organic material (for example various heat resistant resins such as an aromatic polyamide or polyimide).

Preferably, such a film is not melted or substantially deformed under the heat and pressure conditions which the insulation substrate encounters. However, unless the flatness of the surface of the heat resistant film, which is remote from the resin impregnated fibrous sheet, can be kept because of the irregularities of the surface of the resin impregnated fibrous sheet, a film which deforms under the heat and pressure conditions may be used.

In the present invention, it is particularly preferable that the heat resistant film has a breaking strength of not less than 10 kg/mm$^2$. Such a strength improves the adhesion strength of the wiring pattern on the heat resistant film, which results in the wiring board having a high degree of reliability.

A particularly preferable heat resistant film is a heat resistant resin film. For example, films of the following resins may be included in the heat resistant film: an aromatic polyamide (especially, an all-aromatic polyamide), a polyimide, an aromatic polyester (especially, an all aromatic polyester), a polycarbonate, a polysulfone, a polytetrafluoroethylene, a polyhexafluoropropylene, a polyetherketone and a polyphenylene ether.

The highest temperature that the heat resistant film encounters is a temperature at which the resin impregnated in the resin impregnated fibrous sheet is cured, and thus it depends on the resin impregnated fibrous sheet. Generally, the resin impregnated fibrous sheets are roughly classified into two groups 1) a low temperature curing resin sheet having a curing temperature within the range between 120° C. and 180° C., and 2) a high temperature curing resin sheet having a curing temperature within the range between 180° C. and 250° C. The films of the aromatic polyamide (especially, the all-aromatic polyamide), the polyimide and the aromatic polyester can be used as the fibrous sheet in which the high temperature curing resin is impregnated. As to the fibrous sheet in which the low temperature curing resin is impregnated, in addition to those resins, the polycarbonate, the polysulfone, the polytetrafluoroethylene, the polyhexafluoropropylene, the polyetherketone and the polyphenylene ether may be used.

A thickness of the heat resistant film is not particularly limited provided that the irregularities of the surface of the resin impregnated fibrous sheet does not affect the insulation substrate. However, it is not preferable that the thickness is so large that it adversely affects heating of the resin impregnated fibrous sheet for curing. Also, when the thickness is increased, overall compressibilitiy of the insulation substrate is reduced, which is not preferable to the densification of the conductive material. The thickness of the heat resistant film is usually about 10 to 40% of the thickness of the resin impregnated fibrous sheet, and specifically it is at least several micrometers, preferably at least 10 $\mu$m. For example, it may be in the range between 10 $\mu$m and 30 $\mu$m.

Provision of the heat resistant film onto the resin impregnated fibrous sheet may be carried out by bonding with heat and pressure (thermocompression bonding). The thermocompression bonding is carried out by placing the heat resistant film on the resin impregnated fibrous sheet and compressing them while heating them to a temperature at which the impregnated resin is not cured, so that the impregnated resin becomes tacky and thereby the heat resistant film is adhered to the resin impregnated fibrous sheet (thus, adhered with heat and pressure). The pressure applied may be not so large, and the heat and the pressure have to be applied for a short time. For example, when the impregnated resin is an epoxy resin, the thermocompression bonding may be carried out using conditions of a pressure in the range between 0.3 kg/cm$^2$ and 3 kg/cm$^2$ and a temperature in the range between about 80° C. and 140° C. for a period in the range between several seconds and ten and several seconds.

Optionally, an adhesive layer may be present between the heat resistant film and the resin impregnated fibrous sheet, and the adhesive layer is activated so that the heat resistant film and the resin impregnated fibrous sheet are bonded when the thermocompression bonding is carried out. The heat resistant film may have the adhesive layer on a surface which is to face to the resin impregnated fibrous sheet. Such an adhesive layer is made of a heat resistant adhesive which has an adhesion function under curing conditions of the impregnated resin. Such an adhesive may be for example an epoxy resin based adhesive and a polyimide resin based adhesive (which shows the adhesion activity at a temperature lower than the curing temperature of the impregnated resin). From a viewpoint of ensuring the formation of a uniform coating layer on the heat resistant film, a more preferable example of the former is a rubber modified epoxy resin, and a more preferable example of the latter is a polyimide siloxane resin.

When the heat resistant film is provided on the resin impregnated fibrous sheet, the irregularities of the resin impregnated sheet do not affect the surface of the heat resistant film which surface is remote from the resin impregnated sheet (i.e. the exposed surface of the insulation substrate), so that the flatness of the exposed surface of the insulation substrate is substantially ensured.

Next, the release film is provided on the insulation substrate which is prepared as described above. There is no particular limitation on the release film, provided that the release film is flat and functions as a mask which is tentatively placed on the insulation substrate when the conductive material is filled into the through holes, and which is then easily removed thereafter. Generally, a polyester film such as a polyethylene terephthalate (PET) film is used as the release film. Optionally, a release agent may be applied to the release film so as to make the release of the release film from the insulation substrate even easier.

The provision of the release film may be carried out by placing the release film on the insulation substrate followed by thermocompression bonding. In a case in which the thermocompression bonding does not provide a sufficient bond between the release film and the insulation substrate, an adhesive layer may be provided between them. Generally, it is preferable that the adhesive layer is provided between the release film and the insulation substrate, so that they are bonded together through the adhesive layer with the thermocompression bonding. The adhesive layer may be the same as that provided between the heat resistant film and the resin impregnated fibrous resin as described above. Thus, the heat resistant film may have the adhesive layer on either or both sides thereof. The provision of the release film onto the insulation substrate may be carried out by thermocompression bonding under the same conditions as those upon the provision of the heat resistant film onto the resin impregnated fibrous sheet.

Thus, it is also possible that when the heat resistant film is provided on the resin impregnated fibrous sheet and then the release film is provided on the heat resistant film, namely when the steps (1) and (2) are carried out successively, the heat resistant film is placed on the resin impregnated fibrous sheet and the release film is placed on the heat resistant film followed by heating and pressurizing these all while locating and aligning them, so that the steps (1) and (2) are carried out simultaneously, and thereby the pre-wiring board is prepared. In this case, the adhesive layer is present preferably between the heat resistant film and the release film, and more preferably between the heat resistant film and the resin impregnated fibrous sheet.

Therefore, when the through holes are formed through the pre-wiring board and the conductive material such as a conductive paste is filled into the through holes, the release film and the heat resistant film are sufficiently bonded at a flat interface between them, and thereby no conductive material penetrates into the interface. Thus, when the release film is removed subsequently and the wiring pattern is formed, a short circuit is unlikely to be formed between the wiring pattern and the through hole and/or between the through hole and another through hole even though separation between them is reduced in comparison with the conventional arrangement.

When the release film is removed, the exposed surface of the insulation substrate (thus, the exposed surface of the heat resistant film) is substantially flat. Therefore, when the wiring pattern can be formed on such an exposed surface, the formed wiring pattern can be made flat even though the surface of the resin impregnated fibrous sheet has the irregularities, any thus the fine wiring pattern can be formed on the insulation substrate precisely.

In the wiring board according to the present invention, since the insulation substrate includes the resin impregnated fibrous sheet which is compressible, the conductive paste or fine metal particles filled in the through holes through the insulation substrate is compressed when the insulation substrate is heated and pressed, so that the resin component contained in the conductive paste is transferred into the insulation substrate while the conductive material such as the fine metal particles contained in the conductive paste are made into a dandified conductive material, or the fine metal particles are made into a dandified conductive material. Thus, the reliability of the electrical connections as described above (such as ensuring the lower resistance and resistance stability of the conductive material, and ensuring adhesion between the conductive material, and the insulation substrate and the wiring pattern) are easily obtained.

As to bonding between the flat heat resistant film which constitutes the exposed surface of the insulation substrate and the electrically conductive material (for example a metal foil such as a copper foil) for the wiring pattern which is formed on the heat resistant film, the adhesive layer is formed beforehand on the heat resistant film as described above, so that temporary and sufficient bonding strength with the release film can be ensured. After the removal of the release film, since the adhesive layer is left, the presence of the adhesive layer as well as the substantial flatness of the insulation substrate surface (i.e. the heat resistant film surface) ensures sufficient bonding between the conductive material (such as a metal foil) for the wiring pattern and the insulation substrate, so that no etching solution penetrates into an interface between the conductive material and the insulation substrate when the conductive material is etched, and thereby precise patterning is possible.

Further, since as the heat resistant film, a film having a large electrically insulative property and a good antitracking property (such as a polyimide film) can be used, a more reliable wiring board may be produced.

It is noted that the through hole may be referred to as a via hole, an inner via hole or a passing through hole, and generally it is filled with an electrically conductive material such as an electrically conductive paste or fine metal particles (or powder). The conductive material connects predetermined wiring patterns which are provided on the both sides of the insulation substrate. The conductive paste may be one which is generally used for the production of the wiring board having the via holes, and is usually made of a fine and electrically conductive material (for example fine metal particles such as silver and copper and a thermosetting resin (such as an epoxy resin). The through holes may be filled with the paste by for example screen printing. When the conductive paste in the through holes is heated and pressed, at least a portion of the resin component transfers into the inside of the resin impregnated fibrous sheet because of the compressibility of the resin impregnated fibrous sheet, so that the conductive material is converted to an electrically conductive material in which a density of an element which constitutes the conductive material such as the metal particles (or powder) is increased (namely, the member which constitutes the conductive material is densely packed), and such a conductive material connects wiring patterns on the sides of the insulation board.

Based on the above, the wiring board according to the present invention further promotes a large wiring capacity as well as a highly densely electronic part mounting which are peculiar to such a wiring board which has no hollow through hole, and with which an electronic part can be mounted on the wiring pattern (or conductor land) which are located on the through hole filled with the conductive material, and also the reliability of such a wiring board can improved.

After the conductive material is placed in the through holes, the release film is removed, and the materials for the wiring are placed on the both sides of the insulation substrate, at least one side of which is the exposed heat resistant film. When the wiring material is a metal foil such as a copper foil, the provision is carried out by placing the wiring materials and then heating and pressing (namely, thermocompression bonding) them together with the insulation substrate so as to cure the thermosetting resin in the semi-cured condition contained in the insulation substrate and simultaneously bonding the wiring materials and the insulation substrate together.

The above thermocompression bonding is different from the case of the heat resistant film or the release film as previously described in that the thermosetting resin is heated to a temperature equal to or higher than its curing temperature and that the heating and pressing state is maintained for a usually longer period (for example, several tens of minutes to two hours) at a higher pressure (for example, 20 to 100 kg/cm$^2$). Generally, any thermocompression bonding is followed by positively cooling when necessary after the completion of the predetermined heating and pressing.

The thermocompression bonding as described above may be carried out using any suitable apparatus, method and condition. For example, the thermocompression bonding of the heat resistant film and the release film may be carried out using a roller laminator including a heating roller under a pressure in the range between 0.3 kg/cm$^2$ and 3 kg/cm$^2$ for a period in the range between several seconds and ten and several seconds at a temperature in the range between about 80° C. and 140° C. For the thermocompression bonding which carries out curing of the thermosetting resin, a heated press including a heating plate may be used under a pressure in the range between 20 kg/cm$^2$ and 100 kg/cm$^2$ for a period in the range between several tens of minutes and two hours at a temperature in the range between about 120° C. and 250° C.

It is noted that the formation of the wiring pattern may be carried out, in place of the thermocompression bonding of the metal foils as described above, in a manner wherein the wiring pattern has been formed beforehand on a separate release supporting plate, and then such a wiring pattern is transferred to the insulation substrate by placing the supporting plate on the insulation substrate followed by thermocompression bonding and the thermosetting resin is simultaneously cured.

As clearly seen from the above description, the present invention solves the problems created by the irregularities on the surface of the resin impregnated fibrous sheet by means of the heat resistant film provided between the resin impregnated fibrous sheet and the wiring pattern when the wiring pattern is formed on the sheet. Therefore, the present invention is applicable not only to the both side wiring board but also similarly to the multi layer wiring board.

That is, the multi layer wiring board according to the present invention comprises at least three wiring pattern layers and the resin impregnated fibrous sheets each located between two adjacent wiring pattern layers. The heat resistant film is provided between at least one wiring pattern and the resin impregnated sheet, and the wiring patterns are electrically connected by means of an electrically conductive material provided in at least one through hole formed through each resin impregnated fibrous sheet.

As to explanations of the multi layer wiring board according to the present invention, the above descriptions related to the both side wiring board are substantially applicable except that the number of the wiring layers is different, provided that no problem occurs. For example, the descriptions as to the resin impregnated fibrous sheet, the heat resistant film and the release film are applicable. In a particularly preferred embodiment, the heat resistant film is provided between an outermost wiring pattern and the resin impregnated fibrous sheet in the multi layer wiring board. This is because the outermost wiring pattern of the multi layer wiring board can be made fine, so that electronic parts can be highly densely mounted on the multi layer wiring board. With respect to an inside wiring pattern, it is of course possible to employ such a structure in which the heat resistant film is provided between the wiring pattern and the resin impregnated fibrous sheet if necessary.

When the number of wiring patterns layers is many (for example, four to ten layers), such a multi layer wiring board may be produced by forming a structure in which at least one both side wiring board (which has been produced beforehand as described above) and at least one resin impregnated fibrous sheet (in which the conductive material is filled in the predetermined through hole) are superimposed alternately, or forming a structure by further superimposing on said structure, the electrically conductive material for the outermost wiring pattern (such as a metal foil) as an outermost part when necessary, and then heating and pressing the structure so that uncured resin is cured and thereby the structure is made integral. In this case, it is also possible to use in place of the both side wiring board, the multi layer wiring board which has been already produced.

In one preferable embodiment according to the present invention, the multi layer wiring board is provided which is characterized in that at least one both side wiring board (in which predetermined wiring patterns are provided on the both sides of the resin impregnated fibrous sheet and electrically connected by means of the conductive material provided in the through hole(s)) and at least one intermediate connector (which comprises the resin impregnated fibrous sheet containing the conductive material in the through hole(s)) are alternately superimposed. When the intermediate connector forms an outermost member of the multi layer wiring board, the intermediate connector has a predetermined wiring pattern on its outermost surface of the multi layer wiring board. The wiring patterns located on the both sides of the sheet or each intermediate connector are connected by the conductive material in the through hole(s) of the intermediate connector. At least one both side wiring board comprises the heat resistant film between the resin impregnated fibrous sheet and the wiring pattern on at least one side of the both side wiring board. Also, the through hole(s) passes through the heat resistant film and the resin impregnated fibrous sheet.

In one embodiment of such a multi layer wiring board, the number of the both side wiring boards is larger by one than the number of the intermediate connector(s), so that the wiring boards form the outermost members of the multi layer wiring board. At least one of the both side wiring boards which form the outer most members may include the heat resistant film at least between the outermost wiring pattern and the resin impregnated fibrous sheet.

For example, the both side wiring board of the present invention as described is provided on and bonded to each side of the intermediate connector (in which the resin impregnated fibrous sheet as the insulation substrate has the through hole(s) at predetermined position(s) which are filled with the conductive material), so that the wiring patterns of both of the wiring boards are electrically connected by the conductive material in the through hole(s). This example corresponds to the wiring board having four wiring patterns in which the intermediate connector is present between the both layer wiring boards.

In other embodiment of such a multi layer wiring board, the number of the both side wiring board(s) is smaller by one than the number of the intermediate connectors, so that the intermediate connectors form the outermost members of the multi layer wiring board. At least one of the both side wiring boards each of which is adjacent to the intermediate connectors forming each outermost member of the multi layer wiring board may include the heat resistant film at least between a wiring pattern and the resin impregnated fibrous sheet.

For example, the multi layer wiring board is provided in which the intermediate connector (in which the resin impregnated fibrous sheet includes the through hole(s) at predetermined position(s) filled with the conductive material) is provided on each side of the both side wiring board of the present invention as described above. Each of the intermediate connectors includes a predetermined wiring pattern on its surface which is remote from the both side wiring board, and such a wiring pattern is electrically connected, by means of the conductive material in the through hole(s) of the intermediate connector, to the wiring pattern of the both side wiring board which is adjacent to the intermediate connector. Also, this example corresponds to the wiring board having four wiring patterns in which the both layer wiring board is present between the intermediate connectors.

In the multi layer wiring board as described above, an extremely fine wiring pattern can be formed on the heat resistant film contained in the multi layer wiring board. Also, since the wiring boards (which have no hollow through holes and on which electronic parts can be mounted on the through holes filled with the conductive material through the wiring pattern (conductor land)) are connected by means of the intermediate connector, the multi layer wiring board having a large wiring capacity and a large mounting density is provided.

More embodiments of various wiring boards according to the present invention will be hereinafter explained with reference to the drawings.

First Embodiment of the Invention

Figure 2:
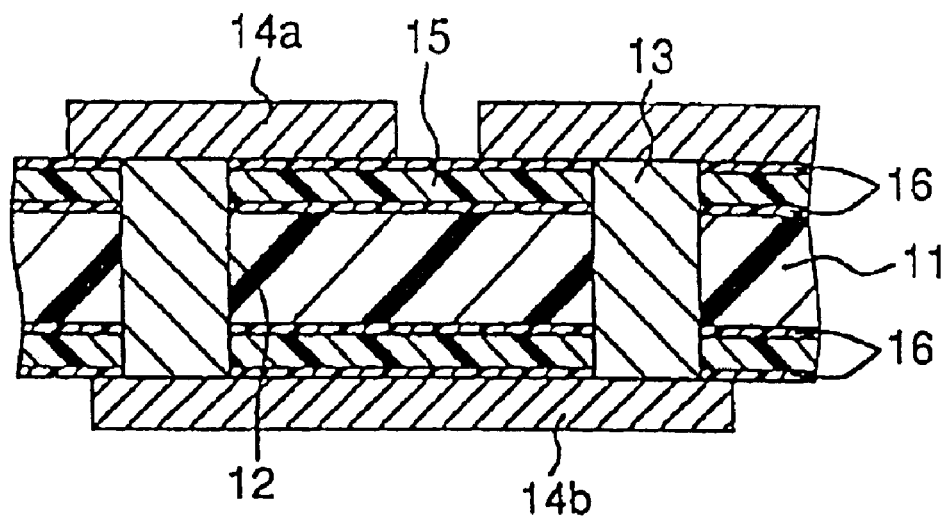
FIG. 2 shows an enlarged cross sectional view of the both side wiring board of the first embodiment of the present invention.

FIG. 1 shows a schematic cross sectional view (which is perpendicular to the main surfaces of the wiring board) of the both side wiring board the first embodiment according to the present invention. FIG. 2 is a schematic enlarged cross sectional view of a portion of FIG. 1.

In FIG. 1, a heat resistant film 15, for example a heat resistant resin film is provided on each side of a resin impregnated fibrous sheet 11 of for example a non-woven fabric of an organic fiber in which the thermosetting resin is impregnated (which has been already cured). The heat resistant film 15 is substantially incompatible with the resin impregnated fibrous sheet 11. The heat resistant film 15 and the resin impregnated fibrous sheet 11 form a composite as the insulation substrate 10. At least one through hole 12 is formed at a predetermined position of the insulation substrate 10, and an electrically conductive material 13 (for example, conductive paste) is provided in the through holes 12. On the heat resistant films 15, which constitute both sides of the insulation substrate 10, there are formed predetermined wiring patterns 14a and 14b, which are electrically connected by means of the conductive material 13. The number and the position of the through holes 12 are determined depending on the wiring patterns 14a and 14b, which are provided on opposite sides of the insulation substrate 10.

As shown in FIG. 2, it is preferable that the heat resistant film 15 comprises an adhesive layer(s) 16 of for example a polyimide resin or an epoxy resin on one side or both sides depending on the material of the heat resistant sheet 15 so as to supplement the adhesion with the resin impregnated fibrous sheet 11 and/or the wiring pattern 14. The resin impregnated in the resin impregnated fibrous sheet 11 can exhibit tackiness upon the thermocompression bonding of the heat resistant sheet, and can be in a molten state by means of heating during the production of the wiring board, and therefore sufficient adhesion can be often ensured between the heat resistant film 15 and the resin impregnated fibrous sheet 11 even without the adhesive layer 16. Since the heat resistant film 15 does not melt during the heating and pressing step so as to cure and compress the impregnated resin for finally producing the wiring board, the adhesion between the wiring pattern 14 and the heat resistant film 15 may be not necessarily sufficient. In that event, it is preferable that sufficient adhesion is ensured between the wiring pattern 14 and the heat resistant film 15 by providing the adhesive layer 16 between them (see FIG. 2).

Figure 3:
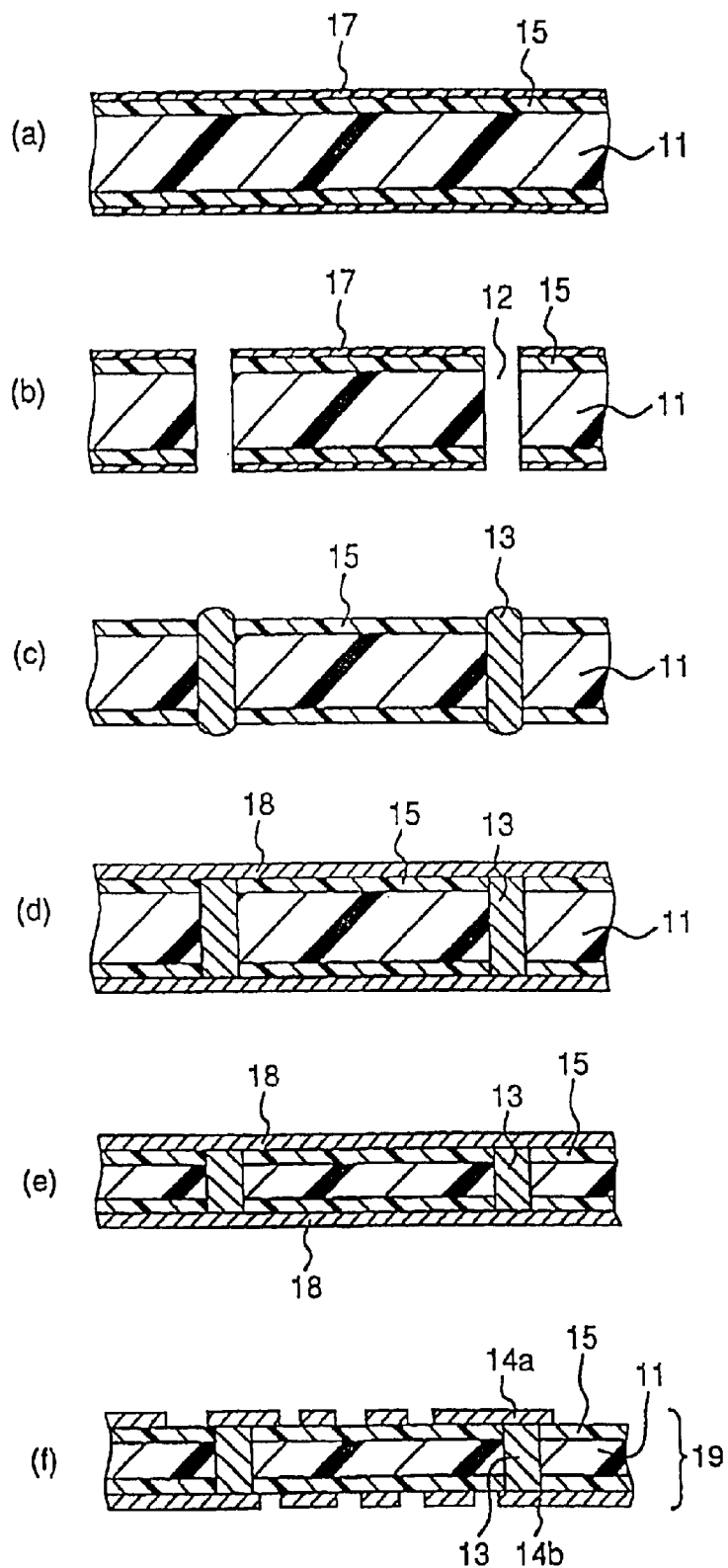
FIGS. 3(a) to (f) show in cross sectional views, a production process of the both side wiring board of the first embodiment of the present invention.

FIG. 3 shows cross sectional views which are similar to FIG. 1, and schematically show the steps for the production of the both side wiring board of the first embodiment according to the present invention.

As the resin impregnated fibrous sheet 11, a porous prepreg having a thickness of 150 μm is prepared which is made of a non-woven fabric of for example an aromatic polyamide (for example aramid) fiber (for example, Kevlar of Du Pont, fineness: 1.5 denier, fiber length: 7 mm, MET-SUKE: 70 g/m$^2$) impregnated with a thermosetting epoxy resin (for example EPON 11511360 of Shell) which is in the semi-cured state. The heat resistant films 15 are bonded with heat and pressure onto the both sides of the prepreg, and on outermost surfaces of the heat resistant films, release films 17, for example polyethylene terephtalate films a having a thickness of 12 μm are further bonded with heat and pressure as shown in FIG. 3(a), so that the pre-wiring board is produced.

As the heat resistant film 15, for example an all aromatic polyamide film (Aramica of Asahi Chemical) having a thickness of 19 μm of which each side has a coating having a thickness of 10 μm of an adhesive 16 (not shown in FIG. 3) comprising a rubber modified epoxy resin or a polyimide siloxane (see FIG. 2) may be used.

Then, the through holes 12 each having a diameter of for example 200 μm are formed as shown in FIG. 3(b) at predetermined positions of the insulation substrate 10 having the release films 17 by for example laser processing using for example a carbon dioxide gas laser.

Then, the conductive material 13 such as a conductive paste or a metal powder is placed in the through holes 12, and thereafter the release films 17 are removed as shown in FIG. 3(c). When the conductive paste is used as the conductive material 13, a conductive paste may be used which is prepared by blending copper particles (85% by weight) having an average diameter of 2 μm in a binder resin of a solventless epoxy resin and uniformly mixing them using a three-roll kneader.

It is noted that a printing method is used for placing the conductive paste 13 into the through holes 12, and the conductive paste 13 is printed and filled by the application of the squeegeeing manner or the roll transferring manner over the release film 17. During the application, the release film 17 functions as a printing mask. Since the surface of the heat resistant film 15, which faces the release film 17, is substantially flat, sufficient adhesion is ensured therebetween, so that no conductive paste protrudes outward from the through holes over the heat resistant film 15.

Then, as shown in FIG. 3(d), the copper foil 18 having a thickness of for example 35 μm is placed on each of the exposed adhesive layers 16 (not shown in FIG. 3).

Thereafter, the composite in the state as shown in FIG. 3(d) is heated and pressed, and thereby thermocompression bonding is carried out, namely, the insulation substrate 11 in the prepreg state and the conductive paste 13 are compressed, so that the impregnated resin and the resin of the conductive paste are cured and also simultaneously the copper foils 18 on the both sides are integrally bonded to the heat resistant films 15. For example, the thermocompression bonding may be carried out by while pressuring at 60 kg/cm$^2$ in a vacuum condition, heating from room temperature to 200° C. over 30 minutes, maintaining a temperature of 200° C. for 60 minutes and then cooling to the room temperature over 30 minutes. As a result of this, a two-sided copper foil adhering circuit substrate is produced as shown in FIG. 3(e) in which the copper foils are electrically connected by means of the conductive paste 13 in the through holes 12.

Finally, the copper foils 18 are patterned by the photolithography method so that the wiring patterns 14a and 14b are formed, and thereby a wiring board 19 having the wiring patterns on both sides is obtained, as shown in FIG. 3(f).

In the production process as described above with reference to FIG. 3, the heat resistant film 15 has the adhesive layer 16 on each side thereof in order to promote the adhesion. However, the adhesive layer 16 on the side of the resin impregnated fibrous sheet 11 may be omitted as described above. Further, when a heat fusible polyimide resin film is used as the heat resistant film, only heating and pressing may provide sufficient adhesion with the resin impregnated fibrous sheet 11 and the copper foil 18. In that event, the application of the adhesive layers 16 on the both sides of the heat resistant film 15 can be omitted.

Figure 4:
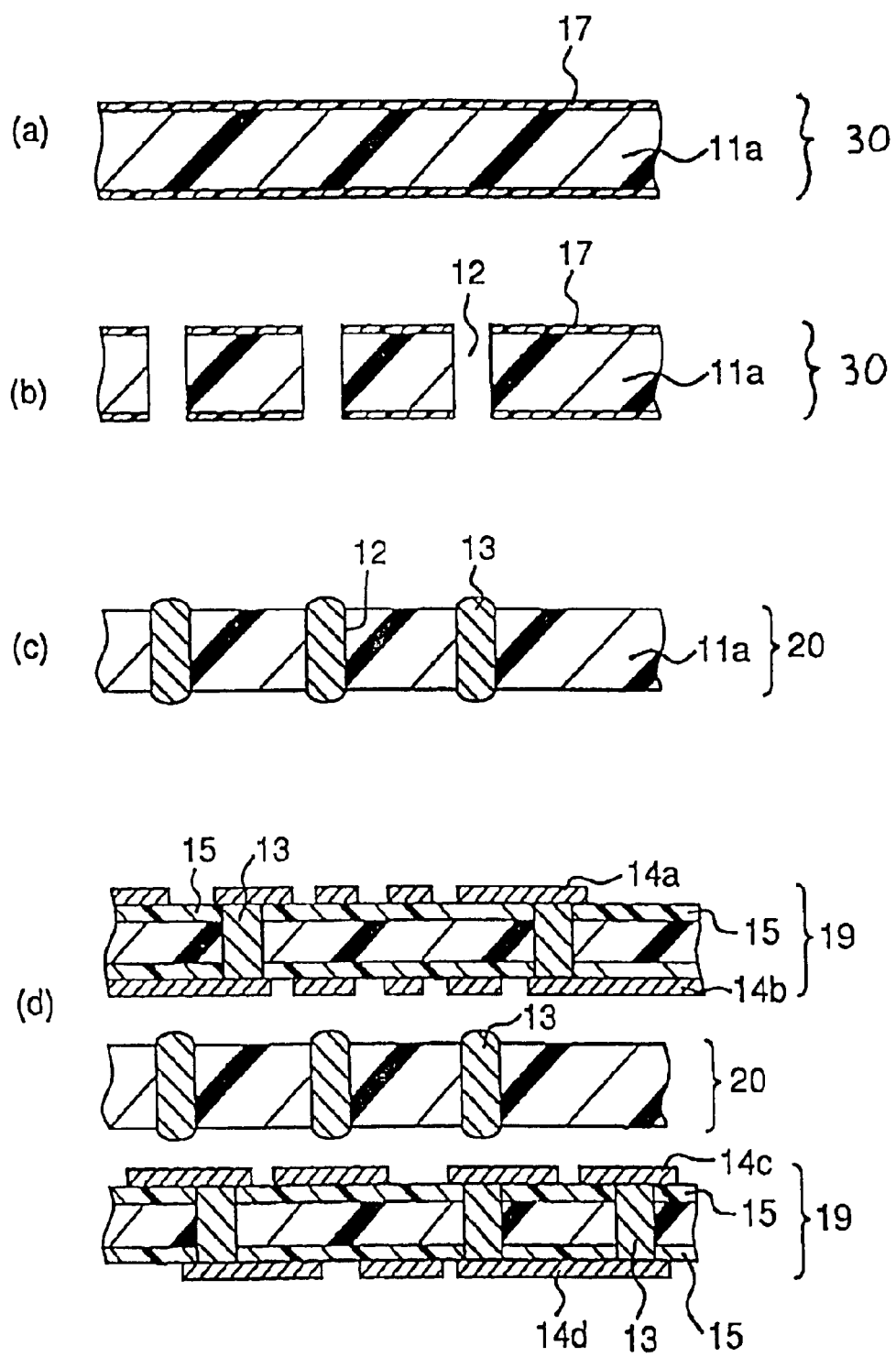
FIGS. 4(a) to (d) show in cross sectional views, a production process of a multi layer wiring board of the first embodiment of the present invention.

FIG. 4 schematically shows in cross sectional views, the steps of the production process of the multi layer wiring board having four wiring layers which is produced by laminating, as described below, the two-sided wiring boards 19 and 19' (FIG. 1) according to the first embodiment as described above such that they sandwich an intermediate connector 20.

First, a preform 30 of the intermediate connector is produced as shown in FIG. 4(a) by providing the release film 17 (made of for example a polyethylene terephthalate film, having a thickness of 12 μm) on each side of the resin impregnated fibrous sheet 11a made of a porous prepreg (for example, made of a non-woven fabric of an aromatic polyamide (aramid) fiber impregnated with a thermosetting epoxy resin, which is in the semi-cured state, having a thickness of 180 μm) by for example thermocompression bonding.

Then, through holes 12 having a diameter of for example 200 μm are formed as shown in FIG. 4(b) at predetermined positions of the preform 30 of the intermediate connector by for example laser processing using a carbon dioxide gas laser, and then the through holes are filled with conductive material 13 such as the conductive-paste or metal powder.

Thereafter, as shown in FIG. 4(c), the release films 17 are removed, and thereby the intermediate connector 20 is obtained.

Then, the intermediate connector 20 is placed between the two-sided wiring boards 19 and 19', each of which contains the predetermined wiring patterns on both sides thereof as shown in FIG. 4(d), and then the boards and the connector are heated and pressed together from the outside, so that the resin impregnated fibrous sheet 11a in the prepreg state and the conductive material 13 are compressed and cured, and the intermediate connector 20 and the wiring boards 19 and 19' are bonded so that the wiring patterns 14b and 14c are electrically connected by the conductive material 13 of the intermediate connector 20. Thereby, a multi layer wiring board having four wiring pattern layers is produced which includes outermost wiring patterns 14a and 14d and inner layer wiring patterns 14b and 14c as shown in FIG. 5.

Figure 5:
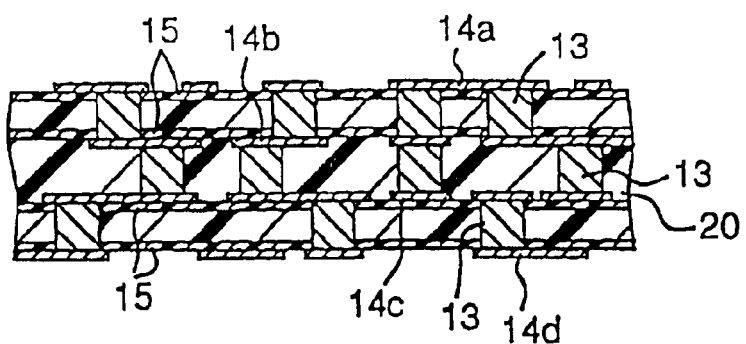
FIG. 5 shows a cross sectional view of the multi layer wiring board of the first embodiment 1 of the present invention.
Figure 6:
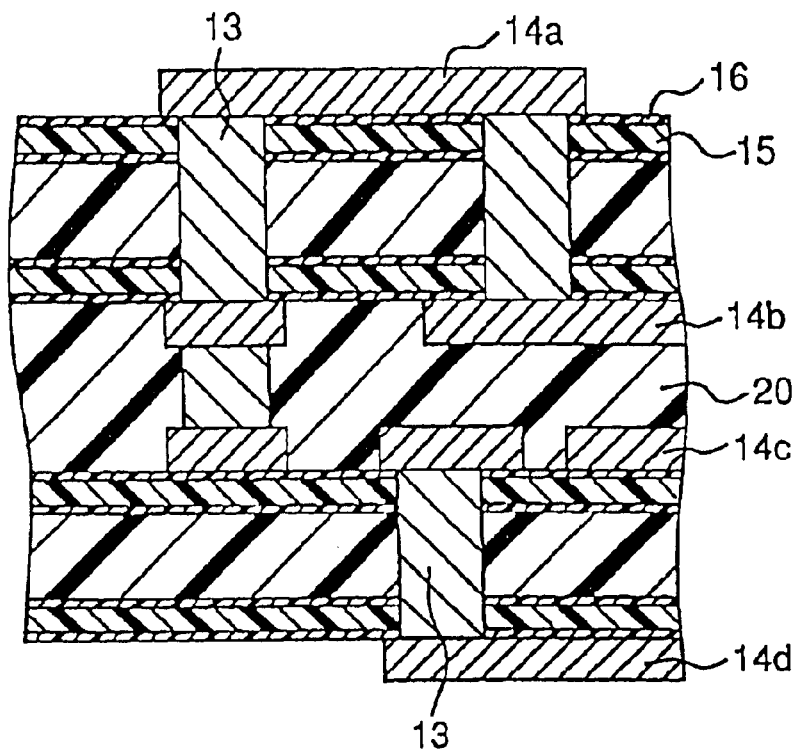
FIG. 6 shows an enlarged cross sectional view of a portion of the multi layer wiring board of first embodiment of the present invention.

FIG. 6 is an enlarged view of a portion of a multi layer wiring board which is similar to the multi layer wiring board having the four wiring layers shown in FIG. 5. In FIG. 6, adhesive layers 16 are provided on both sides of each heat resistant film of each of the outer wiring boards 19 and 19' which are on the outer sides of the board. In the embodiment shown in FIG. 6, no heat resistant film 15 is provided on the surfaces of the intermediate connector 20. However, when high densification and sufficient insulation of the wiring patterns 14b and 14c between the wiring board 19 and/or 19' and the intermediate connector 20 are necessary, the intermediate connector 20 as shown in FIG. 3(c) may be used in which the heat resistant films 15 are provided on the both sides of the resin impregnated fibrous sheet 11, in place of the intermediate connector 20 as shown in FIG. 4(c).

That is, an intermediate connector may be used which can electrically connect the wiring patterns provided on both sides thereof by the conductive material in the through holes which are formed through the insulation substrate comprising the resin impregnated fibrous sheet and the heat resistant film on at least one side, and preferably on both sides of the resin impregnated fibrous sheet. Such an intermediate connector may be produced by the series of steps shown in FIGS. 3(a) to (c). Thus, the irregularities on the surface of the resin impregnated sheet will not affect the exposed surface of the heat resistant film, so that the surface of the heat resistant film is substantially flat. As a result of this, sufficient adhesion is ensured between the heat resistant film and the release film during the production of the intermediate connector. Thereby, since the sufficient adhesion is ensured between the release film and the heat resistant film when the through holes are filled with conductive material, the conductive material does not protrude from the through holes over the heat resistant film. Therefore, the separation between the through holes can be made smaller than conventionally in the intermediate connector. Thus, when such an intermediate connector is used so as to connect the wiring boards, fine wiring patterns can be formed with a high degree of precision.

Thus, the present invention provides the intermediate connector which connects wiring boards provided on both sides thereof, the connector is made of the resin impregnated fibrous sheet and the heat resistant film which is provided on at least one side thereof and includes a through hole(s) at a predetermined position(s), and the conductive material is provided in the through hole(s) so as to connect the wiring boards. It is noted that the thermosetting resin contained in the resin impregnated fibrous sheet of the intermediate connector is in the prepreg state, namely in the semi-cured state.

Second Embodiment of the Invention

Figure 7:
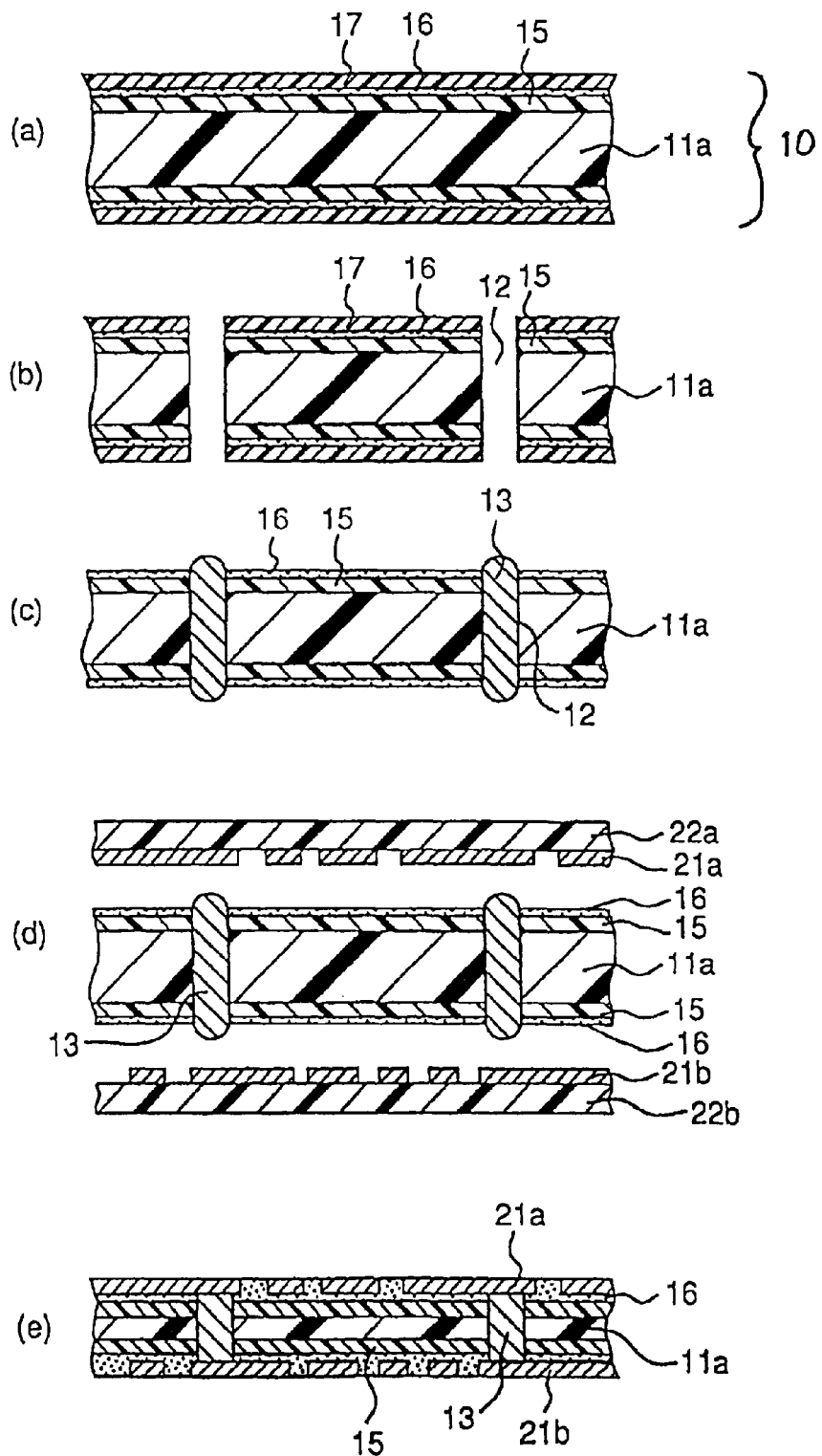
FIGS. 7(a) to (e) show in cross sectional views, a production process of a both side wiring board of a second embodiment of the present invention.

In FIG. 7, the steps are schematically shown in the cross sectional views (along a direction perpendicular to the main surfaces of the substrate) for the production of the both side (two-sided) wiring board of the second embodiment according to the present invention.

First, the insulation substrate 10 is formed with a resin impregnated fibrous sheet 11a (in the prepreg state) a heat resistant film 15 on each side of the sheet, and a release film 17 is provided on each side of the insulation substrate 10 as shown in FIG. 7(a). It is noted that in the illustrated embodiment, the heat resistant film 15 includes an adhesive layer 16 between it and the release film 17.

Then, the through holes 12 are formed as shown in FIG. 7(b).

Thereafter, the through holes are filled with conductive material 13, and then the release films 17 are removed so as to expose the adhesive layers 16 as shown in FIG. 7(c).

The above steps of FIGS. 7(a) to (c) are substantially the same as those of FIGS. 3(a) to (c).

Subsequently to those steps, on both sides of the insulation substrate 11a in the prepreg state (for example, on the both sides of the insulation substrate 10 in which the heat resistant resin films 15 such as an aromatic polyimide films by UPILEX of Ube Industries, Ltd. (exposed surfaces of which has the adhesive layers 16) are provided and the conductive paste 13 is filled into the through holes 12), release supporting plates 22a and 22b (each of which has been separately produced beforehand by providing the release wiring pattern 21a or 21b on one side of the plate) are provided such that the wiring patterns 21a and 21b face the insulation substrate 10. Then, the insulation substrate and the supporting plates are heated and pressed together so that the resin impregnated fibrous sheet 11a in the semi-cured state and the conductive paste 13 are compressed and cured. Thereby, the wiring patterns 21a and 21b are bonded to both sides of the insulation substrate 10 by means of the adhesive layers 16 coated on the surfaces of the heat resistant films 15 and the wiring patterns 21a and 21b which are connected by the conductive paste 13.

After the above thermocompression bonding has been completed, by peeling off the release supporting plates 22a and 22b, a two-sided wiring board is obtained which has a wiring pattern on each side and of which surfaces are flattened as shown in FIG. 7(e). In this way, the wiring patterns 21a and 21b which have been formed beforehand on the release supporting plates 22a and 22b are transferred to the heat resistant resin films having the improved surface flatness through the adhesive layers 16 in the transfer method, so that the finer wiring patterns can be formed with a high degree of precision.

Figure 8:
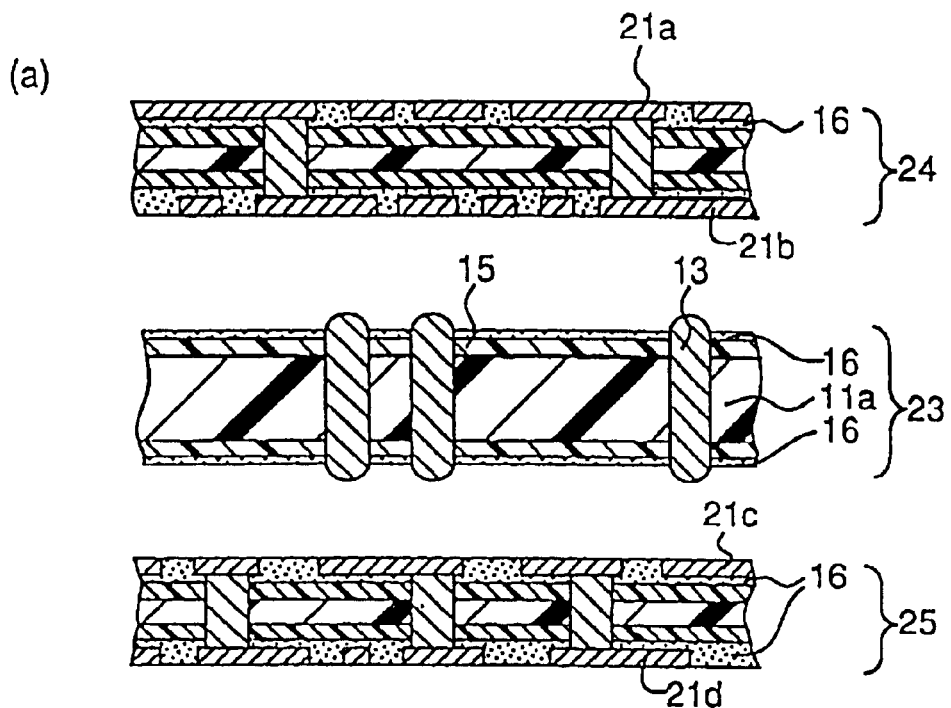
FIGS. 8(a) and (b) show in cross sectional views, a production process of a multi layer wiring board of second embodiment of the present invention.
Figure 8:
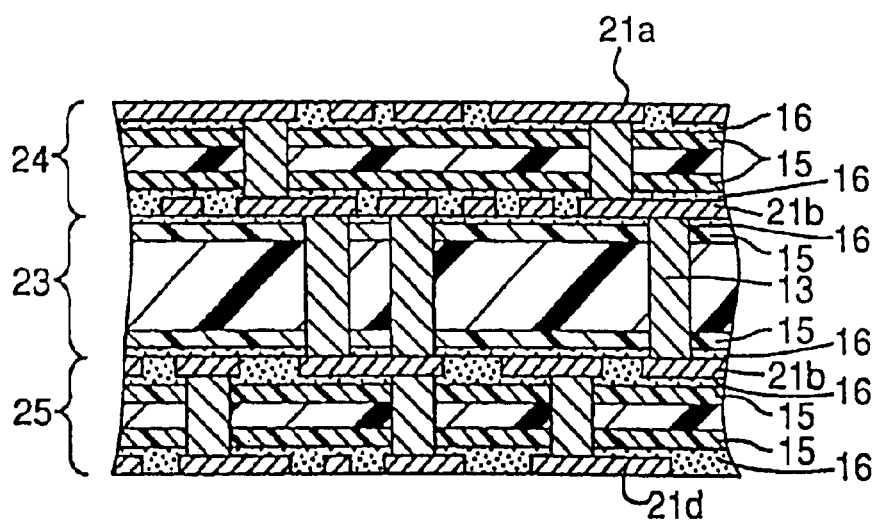

FIG. 8 shows in the cross sectional views, the steps for the production of a multilayer wiring board having four wiring layers by laminating two of the both side wiring boards 24 and 25 of the second embodiment as described above (which are similar to those shown in FIG. 7(e)) such that they sandwich an intermediate connector 23 which will be explained below. The intermediate connector 23 has a structure which is substantially the same as the insulation substrate as shown in FIG. 7(c).

First, as shown in FIG. 8(a), the intermediate connector 23 is formed of a porous prepreg 11a made of a non-woven fabric of for example the aramid fiber which is impregnated with a thermosetting epoxy resin, and a the heat resistant resin film of an all-aromatic polyester film 15 (VECTRA of Kuraray) provided on each side of the prepreg. The film 15 has adhesive layers 16 (TB-1650 of Three Bond, the adhesive layer between the resin impregnated sheet 11a and the heat resistant film 15 is not shown for the simplicity) on its both sides.

The intermediate connector 23 is produced in the steps similar to those of FIGS. 7(a) to (c). The intermediate connector is provided between the wiring boards 24 and 25 on which different wiring patterns 21a, 21b and 21c, 21d are formed, respectively. These boards and the connector are heated and pressed together from the both outsides, so that the resin impregnated fibrous sheet 11a and the conductive paste 13 of the intermediate connector 23 are compressed and the resins contained therein are cured. Thereby, a multi layer wiring board including the four wiring patterns 21a, 21b, 21c and 21d, as shown in FIG. 8(b), can be produced.

In the second embodiment, the intermediate connector 23 includes the heat resistant film 15 on each surface. However, it is possible to use an intermediate connector which contains no heat resistant film 15. Further, as to the resin impregnated fibrous sheet, the aramid fiber-epoxy resin composite has been referred to. However, it is possible to use a glass fiber-epoxy resin composite, a glass fiber-BT resin composite or an aramid fiber-BT resin composite may be used in place of the aramid fiber-epoxy resin composite, and the same effect can be achieved. Also, more than one of the materials may be used.

EXAMPLES

Figure 9:
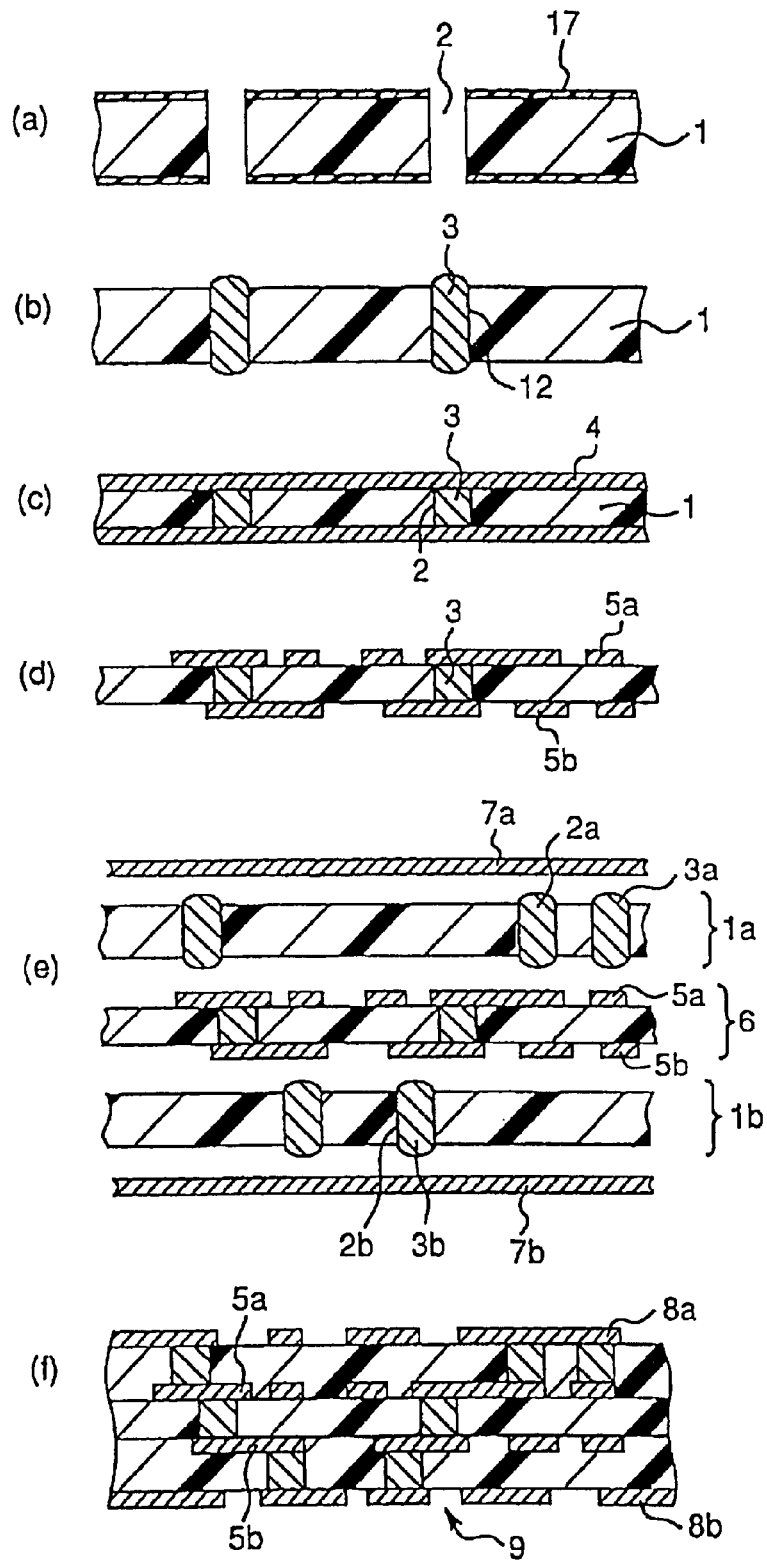
FIGS. 9(a) to (f) show in cross sectional views, a production process of a prior art wiring board.

The first and second embodiments were carried out so that the multi layer wiring boards according to the present invention (as shown FIGS. 5 and 8(b)) were produced each of which had four wiring layers. Also, the wiring board of the prior art (as shown FIG. 9(f)) was produced for the comparison.

Electrical properties of the produced wiring boards were measured and the results are shown in Table 1 below:

TABLE 1

|  | Dielectric Breakdown Voltage, V | Dielectric Constant Change, % | Wiring Fineness (Non-defective Line Ratio), % | | |
| --- | --- | --- | --- | --- | --- |
|  |  |  | 30 μm | 50 μm | 75 μm |
| Embodiment 1 |  |  |  |  |  |
| No. 1 | 1600 | 3.4 | 10 | 37 | 100 |
| No. 2 | 1500 | 1.8 | 12 | 40 | 100 |
| No. 3 | 1800 | 1.5 | 10 | 35 | 100 |
| Embodiment 2 | 1600 | 1.4 | 100 | 100 | 100 |
| Prior Art | 500 | 3.6 | 5 | 21 | 100 |

It is noted that for the heat resistant resin film material, the above No. 1 used an all-aromatic polyamide (Aramica of Asahi Chemical), the above No. 2 used an aromatic polyimide (UPILEX of Ube Industries, Ltd.), the above No. 3 used an all-aromatic polyester (VECTRA of Kuraray).

Also, as the resin impregnated fibrous sheet, the aramid fiber-epoxy resin composite was, used in wiring board.

Each wiring board was subjected to the measurements as to the following three electrical properties:

(1) On each wiring board, a land having a diameter of 0.5 mm was provided next to another land having a diameter of 0.5 mm with a separation of 1.0 mm between the lands, and each land covered the through holes. A wiring having a width of 0.2 mm and a length of 15 mm was connected to each land. A direct current voltage was applied across the wirings and the dielectric breakdown voltage between the lands was measured.

(2) The dielectric constant of the wiring board was measured by a perturbation method using a cavity resonator under the conditions of normal temperature and normal humidity, then the wiring board was allowed in an air conditioned chamber at a temperature of 65° C. and 95% relative humidity (RH) for 250 hours followed by measuring the dielectric constant of the wiring board, and then change of the dielectric constant was obtained.

(3) One hundred wiring patterns each having a line width of 30 μm and a ling length of 10 mm were formed on the outermost surface of each wiring board, and the number of defective lines caused was counted so as to obtain the non-defective line ratio. As the wiring pattern having a line width of 50 μm or 75 μm, the same was repeated.

As clearly seen from Table 1, the dielectric breakdown voltages of the wiring boards of the first and second embodiments were about three times as large as that of the prior art wiring boards.

Also, as to the dielectric constant change, it is contemplated that while the change of No. 1 wiring board of first embodiment is almost the same as that of the prior art wiring board, the changes of Nos. 2 and 3 wiring boards of the first embodiment and the wiring board of the second embodiment (in which the same heat resistant resin film was used as in No. 3) are less than half of that of the prior art wiring board since water absorbance of the used heat resistant resin film is smaller than the all aromatic polyamide of No. 1 wiring board.

Therefore, it is seen that the wiring board having the wiring layer on each side thereof or the wiring board having the multi wiring layers according to the present invention have improved electrical properties over the prior art wiring board.

Also, it is seen that the non-defective line ratios of the wiring board which had the fine wiring pattern having the line width of not larger than 50 μm is better than the ratio of the prior art wiring board, and particularly that the wiring board of the second embodiment having the wiring pattern formed by the transfer method showed such a good result that the non-defective line ratio was 100% (i.e. no defective line).

Effects of the Invention

As clearly seen from the above descriptions, by using the insulation substrate of the resin impregnated fibrous sheet of which at least one side is laminated with the heat resistant film having a flat surface, and electrically connecting the wiring patterns which are formed on the both sides of the insulation substrate by the conductive material filled into the trough hole(s) formed through the insulation substrate, the flat wiring pattern can be formed on the flat surface of the heat resistant film even though the surface of the resin impregnated fibrous sheet has the irregularities, so that the wiring board can be produced which has the highly precisely fine wiring pattern(s).

Also, since the conductive material filled into the through hole(s) formed through the insulation substrate is densified by means of the compressibility of the resin impregnated fibrous sheet as one component of the insulation substrate upon the compression of the insulation substrate, the electrical reliabilities as described above (the resistance lowering of the conductive material, the resistance stability of the conductive material, and ensuring adhesions between the conductive material and the insulation substrate and between conductive material and the wiring patterns) are easily achieved.

Further, the adhesion between the heat resistant film having the flat surface which film constitutes the insulation substrate and the metal foil such as a copper foil for the formation of the wiring pattern on the film is ensured sufficiently strongly by the formation of the adhesive layer on the heat resistant film. In addition, because of the surface flatness of the heat resistant film, the surface of the insulation substrate on which surface the wiring patterns is to be formed is flattened, and the protrusion of the conductive paste over the insulation substrate even when the conductive material which is to be filled in the through hole is the conductive paste, whereby the short circuit formation due to the protrusion can be prevented.

Further, since as the heat resistant film, a film which is highly electrically insulative and well anti-tracking is available at a rather low cost, the wiring board having the improved reliability can be inexpensively produced.

Also, the wiring board according to the present invention has no hollow through hole, and the electronic part can be mounted on the through hole filled with the conductive material through the wiring pattern (conductive land). By means of this together with the possibility of the formation of the fine wiring pattern, it is possible to produce the wiring board providing the large wiring capacity and the highly densely mounting.

It is to be noted that as seen from the above explanations, the present invention includes the following embodiments:

Embodiment 1. The both side wiring board in which the predetermined wiring patterns, formed on both sides of the insulation substrate (which comprises the resin impregnated fibrous sheet and the heat resistant film provided on at least one side of the resin impregnated fibrous sheet), are electrically connected by means of the electrically conductive material filled in the through hole(s) which is formed through the insulation substrate.

Embodiment 2. The both side wiring board according to embodiment 1 wherein the heat resistant film includes the adhesive layer on at least one side thereof on which the wiring pattern is formed, and the heat resistant film and the wiring pattern is connected through the adhesive layer.

Embodiment 3. The both side wiring board according to embodiment 1 or 2 wherein the heat resistant film has a breaking strength of not less than 10 kg/mm$^2$.

Embodiment 4. The both side wiring board according to any one of embodiments 1 to 3 wherein the heat resistant film is selected from the group consisting of films of the aromatic polyamide, the polyimide, the aromatic polyester, the polycarbonate, the polysulfone, the polytetrafluoroethylene, the polyhexafluoropropylene, the polyetherketone and the polyphenylene ether.

Embodiment 5. The both side wiring board according to any one of embodiments 1 to 4 wherein the resin impregnated fibrous sheet is at least one selected from the group consisting of the glass fiber-epoxy resin composite, the glass fiber-bismaleimide triazine resin composite, the aramid fiber-epoxy resin composite and the aramid fiber-bismaleimide triazine resin composite.

Embodiment 6. The multi layer wiring board in which the both side wiring board according to embodiment 1 is laminated on each side of the intermediate connector comprising the resin impregnated fibrous sheet which includes the through hole(s) at the predetermined position(s) and the conductive material filled into the through hole(s), characterized in that when the wiring board according to embodiment 1 includes the heat resistant film on only one side thereof, the heat resistant film is present on the side which is remote from the intermediate connector, and the wiring patterns of both of the both side wiring boards each of which patterns is adjacent to the intermediate connector are electrically connected by the electrically conductive material filled into the through hole(s) of the intermediate connector.

Embodiment 7. The multi layer wiring board in which the intermediate connector comprising the resin impregnated fibrous sheet which includes the through hole(s) at the predetermined position(s) and the conductive material filled into the through hole(s) is provided on each side of the both side wiring board according to embodiment 1, characterized in that each intermediate connector includes the predetermined wiring pattern on the surface which is remote from the both side wiring board, and said wiring patterns on the surfaces of the intermediate connectors which surfaces are remote from the both side wiring board are electrically connected respectively to the wiring patterns of the both side wiring board adjacent to each of the intermediate connectors respectively by means of the electrically conductive material filled in the through holes of the intermediate connectors.

Embodiment 8. The multi layer wiring board in which at least one both side wiring board (in which the predetermined wiring patterns are provided on the both sides of the resin impregnated fibrous sheet and the wiring patterns are electrically connected by means of the electrically conductive material contained in the through hole(s)) and at least one intermediate connector (comprising the resin impregnated fibrous sheet which includes the electrically conductive material filled in the through hole(s)) are alternately arranged, the multi layer wiring board being characterized in that when the intermediate connector forms the outermost member of the multi layer wiring board, said intermediate connector includes the predetermined wiring pattern on its outermost surface, the wiring patterns present on the both sides of each intermediate connector are connected by the electrically conductive material contained in the through hole(s) of the intermediate connector, and at least one both side wiring board includes the heat resistant film at least between the wiring pattern on one side thereof and the resin impregnated fibrous sheet, and the through hole(s) passes through the resin impregnated fibrous sheet and the heat resistant film.

Embodiment 9. The multi layer wiring board according to embodiment 8 wherein the number of the both side wiring boards is larger by one than the number of the intermediate connector(s), so that the both side wiring boards form the both outermost members of the multi layer wiring board, and at least one of the both side wiring boards constituting the outermost members includes the heat resistant film at least between the outermost wiring pattern and the resin impregnated fibrous sheet.

Embodiment 10. The multi layer wiring board according to embodiment 8 wherein the number of the both side wiring board(s) is smaller by one than the number of the intermediate connectors, so that the intermediate connectors form the both outermost members of the multi layer wiring board, and at least one of the both side wiring boards which are adjacent to the intermediate connectors constituting the outermost members of the multi layer wiring board includes the heat resistant film at least between one wiring pattern and the resin impregnated fibrous sheet.

Embodiment 11. The multi layer wiring board according to any one of embodiments 6 to 10 wherein the or at least one intermediate connector includes the heat resistant film on at least one side of the resin impregnated fibrous sheet, and the through hole(s) are formed through the resin impregnated fibrous sheet and the heat resistant film.

Embodiment 12. The multi layer wiring board according to any one of embodiments 6 to 11 wherein the heat resistant film includes the adhesive layer on at least the side where the wiring layer is formed, and the heat resistant film and the wiring pattern are bonded by means of the adhesive layer.

Embodiment 13. The multi layer wiring board according to any one of embodiments 6 to 12 wherein the heat resistant film has a breaking strength of not less than 10 kg/mm$^2$.

Embodiment 14. The multi layer wiring board according to any one of embodiments 2 to 13 wherein the heat resistant film is selected from the group consisting of films of the aromatic polyamide, the polyimide, the aromatic polyester, the polycarbonate, the polysulfone, the polytetrafluoroethylene, the polyhexafluoropropylene, the polyetherketone and the polyphenylene ether.

Embodiment 15. The multi layer wiring board according to any one of embodiments 2 to 14 wherein the resin impregnated fibrous sheet is at least one selected from the group consisting of the glass fiber-epoxy resin composite, the glass fiber-bismaleimide triazine resin composite, the aramid fiber-epoxy resin composite and the aramid fiber-bismaleimide triazine resin composite.

Embodiment 16. The process of producing the both side wiring board in which the predetermined wiring patterns formed on both sides of the insulation substrate (which comprises the resin impregnated fibrous sheet and the heat resistant film provided on at least one side of the resin impregnated fibrous sheet) are electrically connected by means of the electrically conductive material filled in the through hole(s) which is formed through the insulation substrate, comprising the steps of:

(1) providing the heat resistant film on at least one side of the resin impregnated fibrous sheet to form the insulation substrate as the composite, (2) providing the release films on the both sides of the insulation substrate to form the pre-wiring board, (3) forming the predetermined through hole(s) which passes through the insulation substrate and the release films, (4) filling the electrically conductive material in the through hole(s), (5) removing the release films from the pre-wiring board in which the conductive material is filled in the through hole(s), so that the insulation substrate is obtained in which the heat resistant film is exposed on at least one side of the insulation substrate, and (6) providing the metal foils for the wiring patterns on the both sides of the insulation substrate, and heating and pressing the insulation substrate and the metal foils together, so that the resin impregnated in the resin impregnated fibrous sheet is cured and the insulation substrate and the metal foils are made integral, and then the metal foils are formed into the predetermined wiring patterns which are connected by means of the conductive material filled in the through hole(s).

Embodiment 17. The process according to embodiment 18 wherein in place of the step (6), the following step (7) is included:

(7) providing on the both sides of the insulation substrate, the wiring pattern supporting plates (in each of which the predetermined wiring pattern has been formed beforehand on the release supporting plate) while aligning them with the through hole(s), heating and pressing the insulation substrate sandwiched by the plates together so that the resin in the resin impregnated fibrous sheet is cured and the insulation substrate and the wiring pattern supporting plates are made integral, and then removing the release supporting plates, whereby the wiring patterns are transferred to the insulation substrate.

Embodiment 18. The process according to embodiment 16 or 17 wherein the through hole(s) is formed by the laser processing.

Embodiment 19. The process according to any one of embodiments 16 to 18 wherein the electrically conductive material is an electrically conductive paste which is fluid.

Embodiment 20. The process of producing the multi layer wiring board comprising the steps of:

providing the release films on the both sides of the resin impregnated fibrous sheet so that the preform of the intermediate connector is formed;

forming the predetermined through hole(s) through the preform of the intermediate connector and filling the electrically conductive material into the through hole (s), removing the release films from the preform of the intermediate connector in which the conductive material is filled into the through hole(s) so that the intermediate connector is produced, providing between the two intermediate connectors, the both side wiring board produced by the process according to any one of embodiments 16 to 19, providing the metal foil on the side of each intermediate connector which side is remote from the both side wiring board, heating and pressing the structure together including the metal foil, the intermediate connector, the both side wiring board, the intermediate connector and the metal foil which are arranged in this order, so that the resin in the resin impregnated fibrous sheet of the intermediate connector is cured and all the members of the structure are bonded integrally, and then forming the metal foils of the integrally bonded structure which form the outermost layers of the integrally bonded structure into the predetermined wiring patterns, so that the wiring patterns are electrically connected by the conductive material in the through holes of the intermediate connectors, and the both side wiring board.

Embodiment 21. The process according to embodiment 20 wherein the resin impregnated fibrous sheet which is used for the production of at least one intermediate connector includes the heat resistant film on at least one side thereof, the through hole(s) of the intermediate connector passes through the resin impregnated fibrous sheet and the heat resistant film, and when the intermediate connector includes the heat resistant film on only one side thereof, the structure is so produced that the heat resistant film is located on the side which is remote from the both side wiring board.

Embodiment 22. The process of producing the multi layer wiring board by alternately arranging at least one both side wiring boards produced by the process according to any one of embodiments 16 to 19 and at least one intermediate connector according to embodiment 20 or 21, and by heating and pressing them so that the impregnated resin contained in the resin impregnated fibrous sheet of the intermediate connector and they are bonded together, the process being characterized in that:

when intermediate connector forms the outermost member of the multi layer wiring board, the metal foil has been provided before heating and pressing, on the side of the intermediate connector which side constitutes the outermost surface of the multi layer wiring board, and the both side wiring board, the intermediate connector and the metal foil are heated and pressed together.

Embodiment 23. The process according to embodiment 22 wherein the both side wiring board, the intermediate connector and the metal foil are not bonded together in the single step, but at least one both side wiring board and at least one intermediate connector which are adjacent to one another have been already heated and pressed beforehand in other step so as to bond them together.

Embodiment 24. The process according to any one of embodiments 16 to 23 wherein the heat resistant film includes the adhesive layer on at least one side on which the wiring pattern is provided.

Embodiment 25. The multi layer wiring board comprising at least three wiring pattern layers and the resin impregnated fibrous sheets which are located between two wiring pattern layers adjacent to each other, in which the heat resistant film is provided between at least one wiring pattern and the resin impregnated fibrous sheet, and the wiring patterns are electrically connected by means of the conductive material filled in the through hole(s) of each resin impregnated fibrous sheet.

Embodiment 26. The intermediate connector which is used for connecting the wiring boards each provided on each side of the intermediate connector, in which the intermediate connector comprises the resin impregnated fibrous sheet and the heat resistant film which is provided on at least one side of the resin impregnated fibrous sheet, and includes the through hole(s) at the predetermined position(s), in which the electrically conductive material is filled so as to connect the wiring boards.

What is claimed:

1. A wiring board comprising:
   an insulation substrate comprising a resin impregnated fibrous sheet, and a heat resistant film provided on at least one side of said resin impregnated fibrous sheet, wherein at least one through hole is formed through said heat resistant film and said resin impregnated fibrous sheet, and said at least one through hole is filled with an electrically conductive material;
   a first wiring pattern formed on a first side of said insulation substrate;
   a second wiring pattern formed on a second side of said insulation substrate and being electrically connected to said first wiring pattern by said electrically conductive material; and an adhesive layer provided between said heat resistant film and one of said first and second wiring patterns.

2. The wiring board as claimed in claim 1, wherein said heat resistant film has a breaking strength of not less than 10 kg/mm$^2$.

3. The wiring board as claimed in claim 1, wherein said heat resistant film is selected from the group consisting of films of an aromatic polyamide, a polyimide, an aromatic polyester, a polycarbonate, a polysulfone, a polytetrafluoroethylene, a polyhexafluoropropylene, a polyetherketone and a polyphenylene ether.

4. The wiring board as claimed in claim 1, wherein said resin impregnated fibrous sheet is at least one selected from the group consisting of a glass fiber-epoxy resin composite, a glass fiber-bismaleimide triazine resin composite, an aramid fiber-epoxy resin composite and an aramid fiber-bismaleimide triazine resin composite.

5. A multi-layer wiring board comprising an intermediate connector, a first two-sided wiring board laminated on a first side of said intermediate connector, and a second two-sided wiring board laminated on a second side of said intermediate connector, said intermediate connector having a resin impregnated fibrous sheet formed with at least one through hole that is filled with a conductive material, and of said first and second two-sided wiring boards comprising:

an insulation substrate comprising a resin impregnated fibrous sheet, and a heat resistant film provided on at least one side of said resin impregnated fibrous sheet, wherein at least one through hole is formed through said heat resistant film and said resin impregnated fibrous sheet, and said at least one through hole is filled with an electrically conductive material;

a first wiring pattern formed on an inner side of said insulation substrate;

a second wiring pattern formed on an outer side of said insulation substrate and being electrically connected to said first wiring pattern by said electrically conductive material; and an adhesive layer provided between said heat resistant film and one of said first and second wiring patterns, and wherein said first wiring patterns of said first and second two-sided wiring boards are electrically connected by said electrically conductive material of said intermediate connector.

6. The wiring board as claimed in claim 5, wherein said heat resistant film has a breaking strength of not less than 10 kg/mm$^2$.

7. The wiring board as claimed in claim 5, wherein said heat resistant film is selected from the group consisting of films of an aromatic polyamide, a polyimide, an aromatic polyester, a polycarbonate, a polysulfone, a polytetrafluoroethylene, a polyhexafluoropropylene, a polyetherketone and a polyphenylene ether.

8. The wiring board as claimed in claim 5, wherein said resin impregnated fibrous sheet is at least one selected from the group consisting of a glass fiber-epoxy resin composite, a glass fiber-bismaleimide triazine resin composite, an aramid fiber-epoxy resin composite and an aramid fiber-bismaleimide triazine resin composite.

9. A multi-layer wiring board comprising a two-sided wiring board, a first intermediate connector provided on a first side of said two-sided wiring board, and a second connector provided on a second side of said two-sided wiring board, said two-sided wiring board comprising:

an insulation substrate comprising a resin impregnated fibrous sheet, a heat resistant film provided on at least one side of said resin impregnated fibrous sheet, and at least one through hole formed through said heat resistant film and said resin impregnated fibrous sheet, wherein said at least one through hole is filled with an electrically conductive material;

a wiring pattern provided on a first side of said insulation substrate;

a wiring pattern provided on a second side of said insulation substrate, said wiring patterns being electrically connected by said electrically conductive material; and an adhesive layer provided between one of said wiring patterns and said heat resistant film, each of said first and second intermediate connectors comprising:

a resin impregnated fibrous sheet having at least one through hole formed at a predetermined position of said resin impregnated fibrous sheet;

a conductive material provided in said through hole; and a predetermined wiring pattern provided on a surface of said resin impregnated fibrous sheet that is remote from said wiring board, wherein said predetermined wiring pattern of said first intermediate connector is electrically connected to one of said wiring patterns of said two-sided wiring board by said electrically conductive material of said first intermediate connector, and said wiring pattern of said second intermediate connector is electrically connected to the other of said wiring patterns of said two-sided wiring board by said electrically conductive material of said second intermediate connector.

10. The wiring board as claimed in claim 9, wherein said heat resistant film has a breaking strength of not less than 10 kg/mm$^2$.

11. The wiring board as claimed in claim 9, wherein said heat resistant film is selected from the group consisting of films of an aromatic polyamide, a polyimide, an aromatic polyester, a polycarbonate, a polysulfone, a polytetrafluoroethylene, a polyhexafluoropropylene, a polyetherketone and a polyphenylene ether.

12. The wiring board as claimed in claim 9, wherein said resin impregnated fibrous sheet is at least one selected from the group consisting of a glass fiber-epoxy resin composite, a glass fiber-bismaleimide triazine resin composite, an aramid fiber-epoxy resin composite and an aramid fiber-bismaleimide triazine resin composite.

13. A multi-layer wiring board comprising:

a plurality of wiring boards, wherein each of said wiring boards includes predetermined wiring patterns provided on both sides of a resin impregnated fibrous sheet, at least one through hole extending through said resin impregnated fibrous sheet, and an electrically conductive material provided in said through hole, said wiring patterns on both sides of said resin impregnated fibrous sheet being electrically connected by said electrically conductive material, wherein at least one of said wiring boards has a heat resistant film disposed between one of said wiring patterns thereof and said resin impregnated sheet, and an adhesive layer provided on a side of said heat resistant film that opposes said one wiring pattern such that said heat resistant film and said one wiring pattern are bonded together by said adhesive layer; and at least one intermediate connector comprising a resin impregnated fibrous sheet having at least one through hole filled with an electrically conductive material, and wiring patterns provided on both sides of said resin impregnated fibrous sheet, said wiring patterns being electrically connected by said electrically conductive material, wherein said wiring boards and said intermediate connector are alternately arranged so that said wiring patterns directly opposing opposite sides of said intermediate connector are electrically connected by said electrically conductive material provided in said through hole of said intermediate connector.

14. The multi-layer wiring board as claimed in claim 13, wherein the multi-layer wiring board has outermost members, and the number of said wiring boards is larger by one than the number of said intermediate connectors so that said wiring boards form the outermost members of the multi-layer wiring board, and at least one of said outermost members includes said heat resistant film.

15. The multi-layer wiring board as claimed in claim 13, wherein the multi-layer wiring board has outermost members, and the number of said wiring boards is smaller by one than the number of said intermediate connectors so that said outermost members are defined by said intermediate connectors, and one of said wiring boards that are disposed adjacent to said outermost members includes said heat resistant film.

16. A multi-layer wiring board comprising:

at least three wiring pattern layers, each of said wiring patterns having a wiring pattern on both sides thereof;

at least two resin impregnated fibrous sheets, each of said resin impregnated fibrous sheets being interposed between two of said at least three wiring patterns, wherein each of said resin impregnated fibrous sheets has at least one through hole, which is filled with an electrically conductive material;

a heat resistant film provided between at least one of said wiring patterns of said wiring pattern layers and one of said resin impregnated fibrous sheets; and an adhesive layer provided between said heat resistant film and said wiring pattern, wherein said wiring patterns of adjacent wiring pattern layers are electrically connected by said electrically conductive material of said resin impregnated fibrous sheet that is disposed between said adjacent wiring pattern layers.

17. An intermediate connector for connecting wiring boards, said intermediate connector comprising:

a resin impregnated fibrous sheet;

a heat resistant film provided on at least one side of said resin impregnated fibrous sheet;

an adhesive layer provided on said heat resistant film for forming a bond between said heat resistant film and a wiring pattern of one of the wiring boards;

at least one through holes extending through said resin impregnated fibrous sheet and said heat resistant film at a predetermined location; and an electrically conductive material provided in said through hole for electrically connecting the wiring boards.

18. A wiring board comprising:

an insulation substrate comprising a thermosetting resin impregnated fibrous sheet, and a heat resistant film provided on at least one side of said resin impregnated fibrous sheet, wherein at least one through hole is formed through said heat resistant film and said resin impregnated fibrous sheet, and said at least one through hole is filled with an electrically conductive material;

a first wiring pattern formed on a first side of said insulation substrate; and a second wiring pattern formed on a second side of said insulation substrate and being electrically connected to said first wiring pattern by said electrically conductive material, wherein said heat resistant film is selected so as to not melt when said insulation substrate is heated and pressed in order to cure the thermosetting resin which is contained in said insulation substrate.

19. A multi-layer wiring board comprising an intermediate connector, a first two-sided wiring board laminated on a first side of said intermediate connector, and a second two-sided wiring board laminated on a second side of said intermediate connector, said intermediate connector having a thermosetting resin impregnated fibrous sheet formed with at least one through hole that is filled with an electrically conductive material, and each of said first and second two-sided wiring boards comprising:

an insulation substrate comprising a thermosetting resin impregnated fibrous sheet, and a heat resistant film provided on at least one side of said resin impregnated fibrous sheet, wherein at least one through hole is formed through said heat resistant film and said resin impregnated fibrous sheet, and said at least one through hole is filled with an electrically conductive material;

a first wiring pattern formed on an inner side of said insulation substrate; and a second wiring pattern formed on an outer side of said insulation substrate and being electrically connected to said first wiring pattern by said electrically conductive material, wherein said heat resistant films are not melted when said first and second two-sided wiring boards and said intermediate connector are heated and pressed so as to cure the thermosetting resins which are contained in said first and second two-sided wiring boards and said intermediate connector, and wherein said first wiring patterns of said first and second two-sided wiring boards are electrically connected by said electrically conductive material of said intermediate connector.

20. A multi-layer wiring board comprising a two-sided wiring board, a first intermediate connector provided on a first side of said two-sided wiring board, and a second connector provided on a second side of said two-sided wiring board, said two-sided wiring board comprising:

an insulation substrate comprising a thermosetting resin impregnated fibrous sheet, a heat resistant film provided on at least one side of said resin impregnated fibrous sheet, and at least one through hole formed through said heat resistant film and said resin impregnated fibrous sheet, wherein said at least one through hole is filled with an electrically conductive material;

a wiring pattern provided on a first side of said insulation substrate; and a wiring pattern provided on a second side of said insulation substrate, said wiring patterns being electrically connected by said electrically conductive material;

each of said first and second intermediate connectors comprising:
- a thermosetting resin impregnated fibrous sheet having at least one through hole formed at a predetermined position of said resin impregnated fibrous sheet;
- a conductive material provided in said through hole; and
- a predetermined wiring pattern provided on a surface of said thermosetting resin impregnated fibrous sheet that is remote from said wiring board,
- wherein said heat resistant film is not melted when said two-sided wiring board and said first and second intermediate connectors are heated and pressed so as to cure the thermosetting resins which are contained in said two-sided wiring board and said first and second intermediate connectors, and
- wherein said predetermined wiring pattern of said first intermediate connector is electrically connected to one of said wiring patterns of said two-sided wiring board by said electrically conductive material of said first intermediate connector, and said wiring pattern of said second intermediate connector is electrically connected to the other of said wiring patterns of said two-sided wiring board by said electrically conductive material of said second intermediate connector.

21. A multi-layer wiring board comprising:
- a plurality of wiring boards, wherein each of said wiring boards includes predetermined wiring patterns provided on both sides of a thermosetting resin impregnated fibrous sheet, at least one through hole extending through said resin impregnated fibrous sheet, and an electrically conductive material provided in said through hole,
- said wiring patterns on both sides of said resin impregnated fibrous sheet being electrically connected by said electrically conductive material,
- wherein at least one of said wiring boards has a heat resistant film disposed between one of said wiring patterns thereof and said thermosetting resin impregnated sheet,
- at least one intermediate connector comprising a thermosetting resin impregnated fibrous sheet having at least one through hole filled with an electrically conductive material,
- wherein said heat resistant film is not melted when said wiring patterns and said intermediate connector are heated and pressed so as to cure the thermosetting resins which are contained in said wiring patterns and said intermediate connector; and
- wherein said wiring boards and said intermediate connector are alternately arranged so that said wiring patterns directly opposing opposite sides of said intermediate connector are electrically connected by said electrically conductive material provided in said through hole of said intermediate connector.

22. A multi-layer wiring board comprising:
- at least three wiring pattern layers, each of said wiring patterns having a wiring pattern on both sides thereof;
- at least two thermosetting resin impregnated fibrous sheets, each of said resin impregnated fibrous sheets being interposed between two of said at least three wiring patterns, wherein each of said resin impregnated fibrous sheets has at least one through hole, which is filled with an electrically conductive material;
- a heat resistant film provided between at least one of said wiring patterns of said wiring pattern layers and one of said resin impregnated fibrous sheets;
- said heat resistant films being formed of a material that does not melt when said wiring pattern layers and said resin impregnated fibrous sheets are heated and pressed so as to cure the thermosetting resins which are contained in said wiring pattern layers and said resin impregnated fibrous sheets,
- wherein said wiring patterns of adjacent wiring pattern layers are electrically connected by said electrically conductive material of said resin impregnated fibrous sheet that is disposed between said adjacent wiring pattern layers.

23. An intermediate connector for connecting wiring boards, said intermediate connector comprising:
- a thermosetting resin impregnated fibrous sheet;
- a heat resistant film provided on at least one side of said resin impregnated fibrous sheet, said heat resistant film is formed of a material that does not melt when said intermediate connector is heated and pressed to cure the thermosetting resin contained in said intermediate connector;
- at least one through holes extending through said resin impregnated fibrous sheet and said heat resistant film at a predetermined location; and
- an electrically conductive material provided in said through hole for electrically connecting the wiring boards.

* * * * *

UNITED STATES PATENT AND TRADEMARK OFFICE
CERTIFICATE OF CORRECTION

PATENT NO.    : 6,780,493 B2
DATED         : August 24, 2004
INVENTOR(S)   : Osamu Noda et al.

It is certified that error appears in the above-identified patent and that said Letters Patent is hereby corrected as shown below:

Column 25,
Line 26, please insert -- each -- before "of".

Signed and Sealed this

First Day of March, 2005

JON W. DUDAS
*Director of the United States Patent and Trademark Office*